(12) United States Patent
Wang et al.

(10) Patent No.: US 6,622,288 B1
(45) Date of Patent: Sep. 16, 2003

(54) CONFLICT SENSITIVE COMPACTION FOR RESOLVING PHASE-SHIFT CONFLICTS IN LAYOUTS FOR PHASE-SHIFTED FEATURES

(75) Inventors: Yao-Ting Wang, Sunnyvale, CA (US); Kent Richardson, Mountain View, CA (US); Shao-Po Wu, Portola Valley, CA (US); Christophe Pierrat, Santa Clara, CA (US); Michael Sanie, Menlo Park, CA (US)

(73) Assignee: Numerical Technologies, Inc., Mountain View, CA (US)

( * ) Notice: Subject to any disclaimer, the term of this patent is extended or adjusted under 35 U.S.C. 154(b) by 250 days.

(21) Appl. No.: 09/823,146

(22) Filed: Mar. 29, 2001

Related U.S. Application Data

(60) Provisional application No. 60/243,524, filed on Oct. 25, 2000.

(51) Int. Cl.$^7$ ............................................... G06F 17/50
(52) U.S. Cl. ............................... 716/2; 716/12; 716/13
(58) Field of Search ....................... 716/2, 3–21; 430/5

(56) References Cited

U.S. PATENT DOCUMENTS

| | | | |
|---|---|---|---|
| 4,037,918 A | 7/1977 | Kato | 350/3.5 |
| 4,456,371 A | 6/1984 | Lin | 355/71 |
| 5,302,477 A | 4/1994 | Dao et al. | 430/5 |

(List continued on next page.)

FOREIGN PATENT DOCUMENTS

| | | |
|---|---|---|
| DE | 195 45 163 A1 | 6/1996 |
| EP | 0 464 492 A1 | 1/1992 |
| EP | 0 653 679 A2 | 5/1995 |
| EP | 0 698 821 | 2/1996 |
| GB | 2333613 A | 7/1999 |
| JP | 62067547 | 3/1987 |
| JP | 2-140743 | 5/1990 |
| JP | 7-111528 | 2/1991 |
| JP | 6-67403 | 3/1994 |
| JP | 8-51068 | 2/1996 |
| JP | 2650962 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |

OTHER PUBLICATIONS

Cooke, M., "OPC/PSM Designs For Poly Gate Layers", European Semiconductor, vol. 22, No. 7, pp. 57–59, Jul. 2000.

Granik, Y., et al., "Sub–Resolution Process Windows And Yield Estimation Technique Based On Detailed Full–Chip CD Simulation", SPIE, vol. 4182, pp. 335–341 (2000).

(List continued on next page.)

*Primary Examiner*—Vuthe Siek
*Assistant Examiner*—Magid Y Dimyan
(74) *Attorney, Agent, or Firm*—Bever, Hoffman & Harms, LLP; Jeanette S. Harms

(57) ABSTRACT

Techniques for forming a design layout with phase-shifted features, such as an integrated circuit layout, include receiving information about a particular phase-shift conflict in a first physical design layout. The information indicates one or more features logically associated with the particular phase-shift conflict. Then the first physical design layout is adjusted based on that information to produce a second design layout. The adjustments rearrange features in a unit of the design layout to collect free space around a selected feature associated with the phase-shift conflict. With these techniques, a unit needing more space for additional shifters can obtain the needed space during the physical design process making the adjustment. The needed space so obtained allows the fabrication design process to avoid or resolve phase conflicts while forming a fabrication layout, such as a mask, for substantiating the design layout in a printed features layer, such as in an actual integrated circuit.

25 Claims, 12 Drawing Sheets

U.S. PATENT DOCUMENTS

| | | | |
|---|---|---|---|
| 5,308,741 A | 5/1994 | Kemp | 430/312 |
| 5,316,878 A | 5/1994 | Saito et al. | 430/5 |
| 5,324,600 A | 6/1994 | Jinbo et al. | 430/5 |
| 5,328,807 A | 7/1994 | Tanaka et al. | 430/311 |
| 5,334,542 A | 8/1994 | Saito et al. | 437/40 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,432,714 A | 7/1995 | Chung et al. | 364/525 |
| 5,472,814 A | 12/1995 | Lin | 430/5 |
| 5,480,746 A | 1/1996 | Jinbo et al. | 430/5 |
| 5,496,666 A | 3/1996 | Chu et al. | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |
| 5,532,090 A | 7/1996 | Borodovsky | 430/5 |
| 5,533,148 A | 7/1996 | Sayah et al. | 382/240 |
| 5,537,648 A | 7/1996 | Liebmann et al. | 395/500 |
| 5,538,815 A | 7/1996 | Oi et al. | 430/5 |
| 5,539,568 A | 7/1996 | Lin et al. | 359/285 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,631,110 A | 5/1997 | Shioiri et al. | 430/5 |
| 5,635,316 A | 6/1997 | Dao | 430/5 |
| 5,636,131 A | 6/1997 | Liebmann et al. | 364/490 |
| 5,702,848 A | 12/1997 | Spence | 430/5 |
| 5,725,969 A | 3/1998 | Lee | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,815,685 A | 9/1998 | Kamon | 395/500 |
| 5,827,623 A | 10/1998 | Ishida et al. | 430/5 |
| 5,847,959 A | 12/1998 | Veneklasen et al. | 364/468.28 |
| 5,858,580 A | 1/1999 | Wang et al. | 430/5 |
| 5,885,734 A | 3/1999 | Pierrat et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,004,702 A | 12/1999 | Lin | 430/5 |
| 6,009,250 A | 12/1999 | Ho et al. | 395/500.06 |
| 6,009,251 A | 12/1999 | Ho et al. | 395/500.06 |
| 6,010,807 A | 1/2000 | Lin | 430/5 |
| 6,011,911 A | 1/2000 | Ho et al. | 395/500.06 |
| 6,057,063 A | 5/2000 | Liebmann et al. | 430/5 |
| 6,066,180 A | 5/2000 | Kim et al. | 716/19 |
| 6,077,310 A | 6/2000 | Yamamoto et al. | 716/19 |
| 6,077,630 A | 6/2000 | Pierrat | 430/5 |
| 6,081,658 A | 6/2000 | Rieger et al. | 395/500.22 |
| 6,083,275 A * | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,420,074 B2 | 7/2002 | Wang et al. | 430/5 |
| 6,436,590 B2 | 8/2002 | Wang et al. | 430/5 |
| 6,485,871 B1 * | 11/2002 | Kruger et al. | 430/5 |
| 6,493,866 B1 * | 12/2002 | Mayhew | 716/21 |
| 2001/0000240 A1 | 4/2001 | Wang et al. | 430/5 |
| 2001/0028985 A1 | 10/2001 | Wang et al. | 430/5 |
| 2002/0081500 A1 * | 6/2002 | Cobb et al. | 430/5 |
| 2002/0083410 A1 | 6/2002 | Wu et al. | 716/19 |
| 2002/0100005 A1 * | 7/2002 | Anderson et al. | 716/5 |
| 2002/0127479 A1 | 9/2002 | Pierrat | 430/5 |
| 2002/0129327 A1 | 9/2002 | Pierrat et al. | 716/19 |
| 2002/0152454 A1 | 10/2002 | Cote et al. | 716/21 |
| 2002/0155363 A1 | 10/2002 | Cote et al. | 430/5 |
| 2002/0160275 A1 * | 10/2002 | Winder et al. | 430/5 |
| 2002/0192575 A1 * | 12/2002 | Stanton | 430/5 |

OTHER PUBLICATIONS

Plat, M., et al., "The Impact of Optical Enhancement Techniques on the Mask Error Enhancement Funchtion (MEEF)", SPIE, vol. 4000, pp. 206–241, Mar. 1–3, 2000.

Mansuripur, M., et al., "Projection Photolithography", Optics & Photonics News 11, 17 pages. Feb. 2000.

Wang, R., et al., "Plarized Phase Shift Mask: Concept, Design, and Potential Advantages to Photolithography Process and Physical Design", Motorola Semiconductor Product Sector (12 pages) No date.

Ogawa, K., et al., "Phase Defect Inspection by Differential Interference", Lasertec Corporation (12 pages) No date.

Pistor, T., "Rigorous 3D Simulation of Phase Defects in Alternating Phase–Shifting Masks", Panoramic Technolgy Inc. (13 pages) No date.

Semmier A., et al., "Application of 3D EMF Simulation for Development and Optimization of Alternating Phase Shifting Masks", Infineon Technologies AG (12 pages) No date.

Wong, A., et al., "Polarization Effects in Mask Transmission", University of California Berkeley (8 pages) No date.

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Inoue, S., et al., "Simulation Study of Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Ohnuma, H., et al., "Lithography Computer Aided Design Technology for Embedded Memory in Logic", Jpn. J. Appl. Phys., vol. 37, Part I, No. 12B, pp. 6686–6688, Dec. 1998.

Kikuchi, K., et al., "Method of Expanding Process Window for the Double Exposure Technique with alt–PSMs", Optical Microlithography XIII, Proceedings of SPIE, vol. 4000, pp. 121–131 (2000).

Schmidt, R., et al., "Impact of Coma on CD Control for Multiphase PSM Designs", AMD, ASML (11 pages) No date.

Erdmann, A., "Topography Effects and Wave Abberrations in Advanced PSM–Technology", Fraunhofer Institute of Integrated Circuits (11 pages). No date.

Granik, Y., et al., "CD Variation Analysis Technqie and its Application to the Study of PSM Mask Misalignment" Mentor Graphics (9 pages) No date.

Hanyu, et al., "New Phase–Shifitng Mask with Highly Transparent SiO2 Phase Shifters", Fujitsu Laboratories Ltd. (11 pages) No date.

Ishiwata, N., et al., "Fabrication of Phase–Shifting Mask", Fujitsu Limited (11 pages) No date.

Levenson, M., et al., "Phase Phirst! An Improved Strong–PSM Paradigm", M.D. Levenson Consulting, Petersen Advanced Lithography, KLA–Tencor (10 pages) No date.

Levenson, M., et al., "SCAA Mask Exposures and Phase Phirst Design for 110nm and Below", M.D. Levenson Consulting, Canon USA, Inc., JSR Microelectronics, Inc. (10 pages) No date.

Lin, B.J., "The Relative Importance of the Building Blocks for 193nm Optical Lithography", Linnovation, Inc. (12 pages) No date.

McCallum, M., et al., "Alternating PSM Mask Performance—a Study of Multiple Fabrication Technique Results" International SEMATECH (6 pages) No date.

Morikawa, Y., et al., "100nm–alt.PSM Structure Discussion for ArF Lithography", Dai–Nippon Printing Co., Ltd. (15 pages) No date.

Ozaki, T., et al., "A 0.15um KrF Lithography for 1Gb DRAM Product Using Highly Printable Patterns and Thin Resist Process", Toshiba Corporation (2 pages) No date.

Rhyins, P., et al., "Characterization of Quartz Etched PSM Masks for KrF Lithography at the 100nm Node", Photoronics, Inc., MIT Lincoln Lab. Arch Chemicals, Finle Technologies, KLATencor Corp. (10 pages) No date.

Ronse, K., et al., "Thin Film Interference Effects in Phase Shifting Masks Causing Phase and Transmittance Errors", IMEC (15 pages) No date.

Rosenbluth, A., et al., "Optimum Mask and Source Patterns to Print a Given Shape", IBM (17 pages) No date.

Sakata, M., et al., "A Novel Radiaion Sensitive Spin–on–Glass Convertible into SiO2 and the Simple Fabrication Process Using It", Oki Electric Industry Co. Ltd. (3 pages) No date.

Schmidt, R., et al., "Impact of Coma on CD Control for Multiphase PSM Designs", AMD, ASML (10 pages) No date.

Sewell, H., et al., "An Evaluation of the Dual Exposure Technique", SVG Lithography Systems Inc. (11 pages) No date.

Spence, C., et al., "Optimization of Phase–Shift Mask Designs Including Defocus Effects", AMD, Princeton University, Vecor Technologies Inc. (8 pages) No date.

Suzuki, A., et al., "Multilevel Imaging System Realizing k1=–.3 Lithogrpahy", Canon Inc. (13 pages) No date.

Vandenberghe, G., et al., "(Sub–)100nm Gate Patterning Using 248nm Alternating PSM", IMEC, Mentor Graphics (9 pages) No date.

Fritze, M., et al., "100–nm Node Lithography with KrF?", MIT Lincoln, Lab, Numberical Technologies, Photronics, Arch Chemicals (14 pages) No date.

Fukuda, H., et al., "Patterning of Random Interconnect Using Double Exposure of Strong–Type PSMs", Hitachi Central Research Lab (8 pages) No date.

Ferguson, R., et al., "Pattern–Dependent Correction of Mask Topography Effects for Alternating Phase–Shifting Masks", IBM Microelectronics, University of California Berkeley (12 pages) No date.

Toublan, O., et al., "Phase and Transmission Errors Aware OPC Solution of PSM: Feasibility Demonstration", Mentor Graphics Corp. (7 pages) No date.

Yanagishita, Y., et al., "Phase–Shifting Photolithography Applicable to Real IC Patterns", Fujitsu Limited (11 pages) No date.

Levenson, M., et al., "The Phase–Shifting Mask II: Imaging Simulations and Submicrometer Resist Exposures", IEEE Transactions on Electron Devices, vol ED–31, No. 6, pp. 753–763, Jun. 1984.

IBM, "Method to Produce Sizes in Openings in Photo Images Smaller Than Lithographic Minimum Size", IBM Technical Disclosure Bulletin, vol. 29, No. 3, pp. 1328, Aug. 1986.

Buraschi, M., et al., "Optical–Diffraction–Based Modulation of Photoresist Profile or Microlithography Applications", Optical Engineering, vol. 28, No. 6, pp. 654–658, Jun. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Toh, K., et al., "Chromeless Phase–Shifted Masks: A New Approach to Phase–Shifting Masks", BACUS–Tenth Annual Symposium on Microlithography, Sep. 1990 (27 pages).

Yamanaka, T., et al., "A 5.9um2 Super Low Power SRAM Cell Using a New Phase–Shift Lithography", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990).

Watanabe, H., et al., "Transparent Phase Shifting Mask", IEDM, pp. 33.2.1–33.2.4 (1990).

Hirai, Y., et al., "Automatic Pattern Generation System for Phase Shfiting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Burggraaf, P., "Four More Significant Japanese Advances in Phase Shfiting Technology," Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Burggraf, P., "Lithography's Leading Edge, Part 1: Phase–Shift Technology and Part 2: I–Line and Beyond", Semiconductor International, pp. 43–47 and 52–56. Feb. 1992.

Hosono, K., et al., "A Novel Architecture for High Speed Dual Image Generation of Pattern Data for Phase Shifting Reticle Inspection", SPIE—Integrated Circuit Metrology, Inspection and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5819, Dec. 1993.

Ronse, K., et al., "Comparison of Various Phase Shift Strategies and Application to 0.35um ASIC Designs", SPIE—Optical/Laser Microlithography VI, vol, 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al., "Phase–Shifting Lithography: Mask-making and its Application", J. Vac. Sci. Technol. B, vol. 11, No. 6, pp. 2669–2674, Nov./Dec. 1993.

Waas, T., et al., "Automatic Generation of Phase Shift Mask Layouts", Microelectronic Engineering, vol. 23, pp. 139–142 (1994).

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishida, S., et al., "Large Assist Feature Phase–Shift Mask for Sub–Quarter Micrometer Window Pattern Formation", SPIE, vol. 3096, pp. 333–343 (1997).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (Prophet) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages) No date.

Petersen, J., et al., "Designing Dual–Trench Alternating Phase–Shift Masks for 140nm and Smaller Features Using 248–nm KrF and 193–nm ArF Lithography", Bacus News, vol. 14, Issue 8, pp. 1 & 4–13, Aug. 1998.

Kuo, C., et al., "Extension of Deep–Ultraviolet Lithography for Patterning Logic Gates Using Alternating Phase Shifting Masks", J. Vac. Sci. Technol B, vol. 17, No. 6, pp. 3296–3300, Nov./Dec. 1999.

Palmer, S., et al., "Dual Mask Model–Based Proximity Correction for High Performance 0.10um CMSO Process", The 44th International Conference on Electron, Ion and Photon Beam Technology and Nanofabrication Abstracts, pp. 18–19, May 30–Jun. 2, 2000.

Pieratt, C., "Investigation of Proximity Effects in Alternating Aperture Phase Shifting Masks", Numerical Technologies, Inc. (11 pages) No date.

Ackmann, P. et al., "Phase Shifting And Optical Proximity Corrections To Improve CD Control On Logic Devices In Manufacturing For Sub 0.35 $\mu$m I–Line", Advance Micro Devices (8 pages) No date.

Asai, S. et al., "High Performance Optical Lithography Using A Separated Light Source", J. Vac. Sci. Technol. B, vol. 10, No. 6, pp. 3023–3026, Nov./Dec. 1992.

Barouch, E. et al., "Optimask: An OPC Algorithm For Chrome And Phase–Shift Mask Design", SPIE, vol. 2440, pp. 192–206, Feb. 1995.

Brunner, T. et al., "170nm Gates Fabricated By Phase–Shift Mask And Top Anti–Reflector Process", SPIE, Optical/Laser Microlithography VI, vol. 1927, pp. 182–189 (1993).

Brunner, T., "Rim Phase–Shift Mask Combined With Off–Axis Illumination: A Path To 0.5$\lambda$/Numerical Aperture Geometries", Optical Engineering, vol. 32, No. 10, p. 2337–2343, Oct. 1993.

Fukuda, H. et al., "Determination Of High–Order Lens Aberration Using Phase/Amplitude Linear Algebra", J. Vac. Sci. Technol. B, vol. 17, No. 6, pp. 3318–3321, Nov./Dec. 1999.

Fukuda, H., "Node–Connection/Quantum Phase–Shifting Mask: Path To Below 0.3 $\mu$m Pitch, Proximity Effect Free, Random Interconnects And Memory Patterning", J. Vac. Sci. Technol. B, vol. 17, No. 6, pp. 3291–3295, Nov./Dec. 1999.

Galan, G. et al., "Application Of Alternating–Type Phase Shift Mask To Polysilicon Level For Random Logic Circuits", Jpn. J. Appl. Phys., vol. 33, pp. 6779–6784 (1994).

Harafuji, K. et al., "A Novel Hierarchical Approach For Proximity Effect Correction In Electron Beam Lithography", IEEE, vol. 12, No. 10, pp. 1508–1514, Oct. 1993.

Inokuchi, K. et al., "Sub–Quarter Micron Gate Fabrication Process Using Phase–Shifting–Mask For Microwave GaAs Devices", Extended Abstracts of the 1991 Intl. Conference on Solid State Devices and Materials, Yokohama, Japan, pp. 92–94 (1991).

Inokuchi, K. et al., "Sub–Quarter–Micron Gate Fabrication Process Using Phase–Shifting Mask For Microwave GaAs Devices", Japanese Journal of Applied Physics, vol. 30, No. 12B, pp. 3818–3821, Dec. 1991.

Ishiwata, N. et al., "Novel Alternating Phase Shift Mask With Improved Phase Accuracy", SPIE, Proceedings of the 17th Annual Symposium on Photomask Technology and Management, vol. 3236, pp. 243–249 (1997).

Jinbo, H. et al., "0.2 $\mu$m Or Less i–Line Lithography By Phase–Shifting–Mask Technology", IEEE, pp. 33.3.1–33.3.4 (1990).

Jinbo, H. et al., "Application Of Blind Method To Phase–Shifting Lithography", IEEE, 1992, Symposium on VLSI Technology Digest of Technical Papers, pp. 112–113 (1992).

Jinbo, H. et al., "Improvement Of Phase–Shifter Edge Line Mask Method", *Japanese Journal of Applied Physics,* vol. 30, No. 11B, pp. 2998–3003, Nov. 1991.

Karklin, L., "A Comprehensive Simulation Study Of The Photomask Defects Printability", *SPIE,* vol. 2621, pp. 490–504 (1995).

Kimura, T. et al., "Subhalf–Micron Gate GaAs Mesfet Process Using Phase–Shifting–Mask Technology", *IEEE,* GaAs IC Symposium, pp. 281–284 (1991).

Levenson, M. et al., "Improving Resolution In Photolithography With A Phase–Shifting Mask", *IEEE* Transactions on Electron Devices, vol. ED–29, No. 12, pp. 1828–1836, Dec. 1982.

Lin. B.J., "Phase–Shifting Masks Gain An Edge", *IEEE* Circuits & Devices, pp. 28–35, Mar. 1993.

Liu, H.Y. et al., "Fabrication of 0.1 $\mu$m T–Shaped Gates By Phase–Shifting Optical Lithography", *SPIE,* Optical/Laser Microlithography VI, vol. 1927, pp. 42–52 (1993).

Matsuoka, K. et al., "Application Of Alternating Phase–Shifting Mask To 0.16 $\mu$m CMOS Logic Gate Patterns", Matsushita Electric Ind. Co., Ltd. (9 pages) No date.

Mizuno, F. et al., "Practical Phase–Shifting Mask Technology For 0.3 $\mu$m Large Scale Integrations", *J. Vac. Sci. Technol. B,* vol. 12, No. 6, pp. 3799–3803, Nov./Dec. 1994.

Morimoto, H. et al., "Next Generation Mask Strategy— Technologies Are Ready For Mass Production Of 256MDRAM?", *SPIE,* vol. 3236, pp. 188–189 (1997).

Neureuther, A., "Modeling Phase Shifting Masks", *SPIE,* 10$^{th}$ Annual Symposium Microlithography, vol. 1496, pp. 80–85 (1990).

Nistler, J. et al., "Large Area Optical Design Rule Checker For Logic PSM Applications", *SPIE,* Photomask and X–Ray Mask Technology, vol. 2254, pp. 78–92 (1994).

Nistler, J. et al., "Phase Shift Mask Defect Printability Analysis", Proceedings of the Microlithography Seminar Interface '93, OCG Microelectronic Materials, Inc., pp. 11–28 (1993).

Ohtsuka, H. et al., "Phase Defect Repair Method For Alternating Phase Shift Masks Conjugate Twin–Shifter Method", *Jpn. J. Appl. Phys.,* vol. 31, pp. 4143–4149 (1992).

Pati, Y.C. et al., "Phase–Shifting Masks For Microlithography: Automated Design And Mask Requirements", *J. Opt. Soc. Am.,* vol. 11, No. 9, pp. 2438–2452, Sep. 1994.

Pierrat, C. et al., "A Rule–Based Approach to E–Beam And Process–Induced Proximity Effect Correction For Phase–Shifting Mask Fabrication", *SPIE,* vol. 2194, pp. 298–309 (1994).

Pierrat, C. et al., "Phase–Shifting Mask Topography Effects On Lithographic Image Quality", *IEEE,* pp. 3.3.1–3.3.4 (1992).

Rieger, M. et al., "System For Lithography Proximity Compensation", Precim Company, Portland, Oregon, Sep. 1993 (28 pages).

Rieger, M. et al., "Using Behavior Modeling for Proximity Correction", Precim Company, Portland, Oregon (6 pages) No date.

Roman, B. et al., "Implications Of Device Processing On Photomask CD Requirements", *SPIE,* vol. 3236 (1997) (Abstract Only).

Spence, C. et al., "Automated Determination Of CAD Layout Failures Through Focus: Experiment And Simulation", *SPIE,* vol. 2197, pp. 302–313 (1994).

Spence, C. et al., "Detection Of 60° Phase Defects On Alternating PSMs", Advance Micro Devices, KLA–Tencor, DuPont RTC (2 pages) No date.

Spence, C. et al., "Integration Of Optical Proximity Correction Strategies In Strong Phase Shifters Design For Poly–Gate Layers", *Bacus News,* vol. 15, Issue 12, pp. 1, 4–13, Dec. 1999.

Stirniman, J. et al., "Wafer Proximity Correction And Its Impact On Mask–Making", *Bacus News,* vol. 10, Issue 1, pp. 1, 3–7, 10–12, Jan. 1994.

Sugawara, M. et al., "Defect Printability Study Of Attenuated Phase–Shifting Masks For Specifying Inspection Sensitivity", Semiconductor Company, Sony Corporation, Kanagawa, Japan (16 pages) No date.

Terasawa, T. et al., "0.3–Micron Optical Lithography Using a Phase–Shifting Mask", *SPIE,* Optical/Laser Microlithography II, vol. 1088, pp. 25–33, Mar. 1989.

Watanabe, H. et al., "Detection And Printability Of Shifter Defects In Phase–Shifting Masks II Defocus Characteristics", *Jpn. J. Appl. Phys.,* vol. 31, pp. 4155–4160 (1992).

Wiley, J. et al., "Phase Shift Mask Pattern Accuracy Requirements And Inspection Technology", *SPIE,* Integrated Circuit Metrology, Inspection, and Process Control V, vol. 1464, pp. 346–355 (1991).

\* cited by examiner

CONFLICT SENSITIVE COMPACTION FOR RESOLVING PHASE-SHIFT CONFLICTS IN LAYOUTS FOR PHASE-SHIFTED FEATURES

CLAIM OF PRIORITY

This application claims priority to U.S. provisional application serial No. 60/243,524, filed Oct. 25, 2000 entitled "Incrementally Resolved Phase-Shift Conflicts In Layouts For Phase-Shifted Features" by Shao-Po Wu, Yao-Ting Wang, Kent Richardson, Christophe Pierrat, and Michael Sanie.

RELATED APPLICATIONS

This application is related to U.S. patent application Ser. No. 09/823,380, entitled "Incrementally Resolved Phase-Shift Conflicts in Layouts for Phase-Shifted Features," filed on the same day herewith, invented by Shao-Po Wu and Yao-Ting Wang.

BACKGROUND OF THE INVENTION

1. The Field of the Invention

This invention relates to the field of integrated circuit manufacturing. In particular, this invention relates to adjusting design layouts to eliminate phase-shift conflicts for shifters on masks used to fabricate integrated circuits.

2. Description of Related Art

Conventional integrated circuit (IC) fabrication involves many steps in common with other processes that impose physical structures in a layer on a substrate, such as laying ink in patterns on a page, or laying chrome in patterns on a quartz substrate. Some of the important steps viewed at a high level are depicted in FIG. 1.

In step 110, engineers use a functional computer aided design (CAD) process, to create a schematic design, such as a schematic circuit design consisting of individual devices coupled together to perform a certain function or set of functions. The schematic design 115 is translated into a representation of the actual physical arrangement of materials upon completion, called a design layout 125, with a physical CAD process 120. If multiple layers are involved, as is typical for an IC, a design layout is produced for each layer, e.g., design layouts 125a, 125b, etc. FIG. 2 shows a sample design layout. A fabrication CAD process 130 produces one or more fabrication layouts 135, such as masks for each design layout 125a. The one or more fabrication layouts 135 are then used by a substantiation process 140 to actually produce physical features in a layer, called here the printed features layer 149.

One recent advance in optical lithography called phase shifting generates features in the printed features layer 149 that are smaller than the features on the mask 135a projected onto the printed features layer 149. Such fine features are generated by the destructive interference of light in adjacent separated windows in the mask called shifters. FIG. 3 shows two adjacent shifters, 310 and 312, in a mask 300. The shifters 310 and 312 are light transmissive areas on the mask separated by an opaque area 311 with a width of Wm 313 when projected onto the printed features layer 149. The projection of Wm onto the printed features layer 149 is limited by the resolution of the optical process. However, if the light of a single wavelength passing through one of the shifters, e.g. 310, is out of phase (by 180 degrees or $\pi$ radians) with the light of the same wavelength passing through the other shifter, e.g. 312, then an interference pattern is set up on the printed features layer 149 during the substantiation process 140. This interference generates a printed feature 350 having a width Wp 353 that is less than the width Wm 313 of the opaque area projected onto the printed features layer 149. In other embodiments, the width 313 and width 353 are much closer and can be equal. In each case, the width 353 of the printed feature is less than can be produced by the same optical system without phase shifting.

The use of phase shifting puts extra constraints on the fabrication layouts 135, and hence on the design layout, e.g. 125a. These constraints are due to several factors. One factor already illustrated is the need for finding space on the mask, e.g., 135a, for the two shifters, 310 and 312, as well as for the opaque area 311 between them. This precludes the one mask from placing additional features on the printed features layer 149 in the region covered by the projection of the two shifters 310 and 312 and the opaque area 311. Another factor is that overlapping or adjacent shifters on a single mask, used, for example, to generate neighboring phase-shifted features, generally do not have different phases. Adjacent shifters with different phases will produce a spurious feature.

Currently, design layouts 125 may provide the space needed for placement of phase shifters through design rules, but shifters are actually placed and simultaneously assigned a phase in the conventional fabrication design steps, not shown, in attempts to produce the fabrication layouts. As complex circuits are designed, such as by combining many standard cells of previously designed sub-circuits, shifters of different phases may overlap or become adjacent in the layouts, leading to phase-shift conflicts. It is generally recognized that resolving phase-shift conflicts should be done globally, after the whole circuit is laid out, because swapping the phases of a pair of shifters to resolve one conflict can generate a new conflict with another neighboring feature already located in the design or one added later. The conventional IC design systems try to reassign phases of individual pairs to resolve the conflicts at the end of the design process when all the phase conflicts are apparent. For example, iN-Phase™ software from NUMERICAL TECHNOLOGIES, INC.™ of San Jose, Calif., uses this conventional technique.

For example, FIG. 4 shows a T-junction element 440 that is desirably formed with narrow phase-shifted features 443, 442 and 444 as well as with wide non-critical features 441 and 445. FIG. 4A shows a pair of shifters 410 and 420 needed to form the vertical phase-shifted feature 443 of element 440. FIG. 4A also shows another shifter 415 disposed opposite shifter 410 to form the left half 442 of the horizontal phase-shifted feature of element 440. Similarly, FIG. 4A also shows a fourth shifter 425 disposed opposite shifter 420 to form the right half 444 of the horizontal phase-shifted feature of element 440. Shifters 415 and 425 are so close that they violate a design rule requiring at least a minimum spacing X between adjacent shifters. That is, separation 427 is less than X.

In the conventional fabrication CAD process, not shown, the shifters 410, 420, 415 and 425 are placed as shown and assigned phases, but the phase-shift conflict is not addressed until all the elements of the design layout have been accounted for. Then the design rule is applied in which shifters 415 and 425 are replaced by a single shifter 430.

However, there is no assignment of phase for shifter 430 that can simultaneously be opposite to the phases assigned to shifters 410 and 420, because shifters 410 and 420 are already opposite to each other. Thus such a design has a conflict that cannot be solved by changing the phases assigned to the shifters. Some re-arrangement of shifters or features or both is needed. In this example, however, the feature 440 from the physical design layout does not allow shifter 430 to be moved and does not allow another shifter to be inserted. Thus the fabrication CAD process 130 cannot move or change the shifters enough to resolve the conflict.

When a phase-shift conflict is irresolvable by the fabrication CAD process 130, then the physical CAD process 120 is run again to move or reshape the features, such as those of element 440. Process flow with an irreconcilable phase-shift conflict is represented in FIG. 1, which shows that fabrication layouts 135 are produced along the arrow marked "Succeed" if the fabrication CAD process 130 succeeds, but that control returns to the physical CAD process 120 along the arrow marked "Fail" if the fabrication CAD process 130 fails, such as if it fails to resolve all phase conflicts.

While suitable for many purposes, the conventional techniques have some deficiencies. As designs, such as designs for IC circuits, become more complex, the time and effort involved in performing the physical CAD process 120 and the fabrication CAD process 130 increase dramatically, consuming hours and days. By resolving phase-shift conflicts at the end of this process, circumstances that lead to irresolvable phase-shift conflicts are not discovered until the end of these time consuming processes. The discovery of such irresolvable phase-shift conflicts induces the design engineers to start over at the physical CAD process 120. The processes 120 and 130 are repeated until final design layouts and fabrication layouts without phase-shift conflicts are produced. This procedure multiplies the number of days it takes a foundry to begin producing IC chips. In a commercial marketplace where IC advancements occur daily, such delays can cause significant loss of market share and revenue.

Techniques are needed to discover and resolve phase-shift conflicts earlier in the sequence of physical layout designing and fabrication layout designing. Repeatedly assigning phases to the same shifters is undesirable in such techniques, however, because such repetition indicates inefficient processing and wasted processing resources.

SUMMARY OF THE INVENTION

Techniques for forming a design layout with phase-shifted features, such as an integrated circuit layout, are described. The techniques include receiving information about a particular phase-shift conflict in a first physical design layout. The information indicates features that are logically associated with the particular phase-shift conflict. Then the first physical design layout is adjusted based on that information to produce a second design layout. By identifying potentially many features that are logically associated with the phase-shift conflict, many more options for adjusting the first physical design layout can be evaluated and a better overall solution to the phase conflict can be used. For example, the adjustment need not be made in the vicinity of the phase-shift conflict; but, instead, can be made in the vicinity of any of the logically associated features. One of these logically associated features may be more conveniently adjusted than the feature at the phase-shift conflict. For example, there may be more space in which to resolve a phase shift around the selected feature than is available around the feature where the phase conflict is first identified. For another example, the selected feature might be redesigned to be non-critical and therefore forego the use of shifters entirely. These techniques therefore may substantially simplify and reduce the costs of the redesign process in many circumstances.

In some embodiments, a phase-assignment graph is generated that logically associates the one or more features with the particular phase-shift conflict. In some embodiments, the adjusting is performed on the first physical design layout to a selected feature of the one or more features. In some embodiments the adjusting step involves changing the selected feature to a non-critical feature that does not use phase shifting. In some embodiments, the adjusting involves reverse compaction to consolidate empty space for the second design layout. In some embodiments, multiple potential solutions to a phase conflict are generated based on the logically associated features, the solutions are evaluated, and the solution providing a most favorable value is picked.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENT

A method and apparatus for fabricating printed features layers, such as in integrated circuits, are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

FUNCTIONAL OVERVIEW

Figure 1:
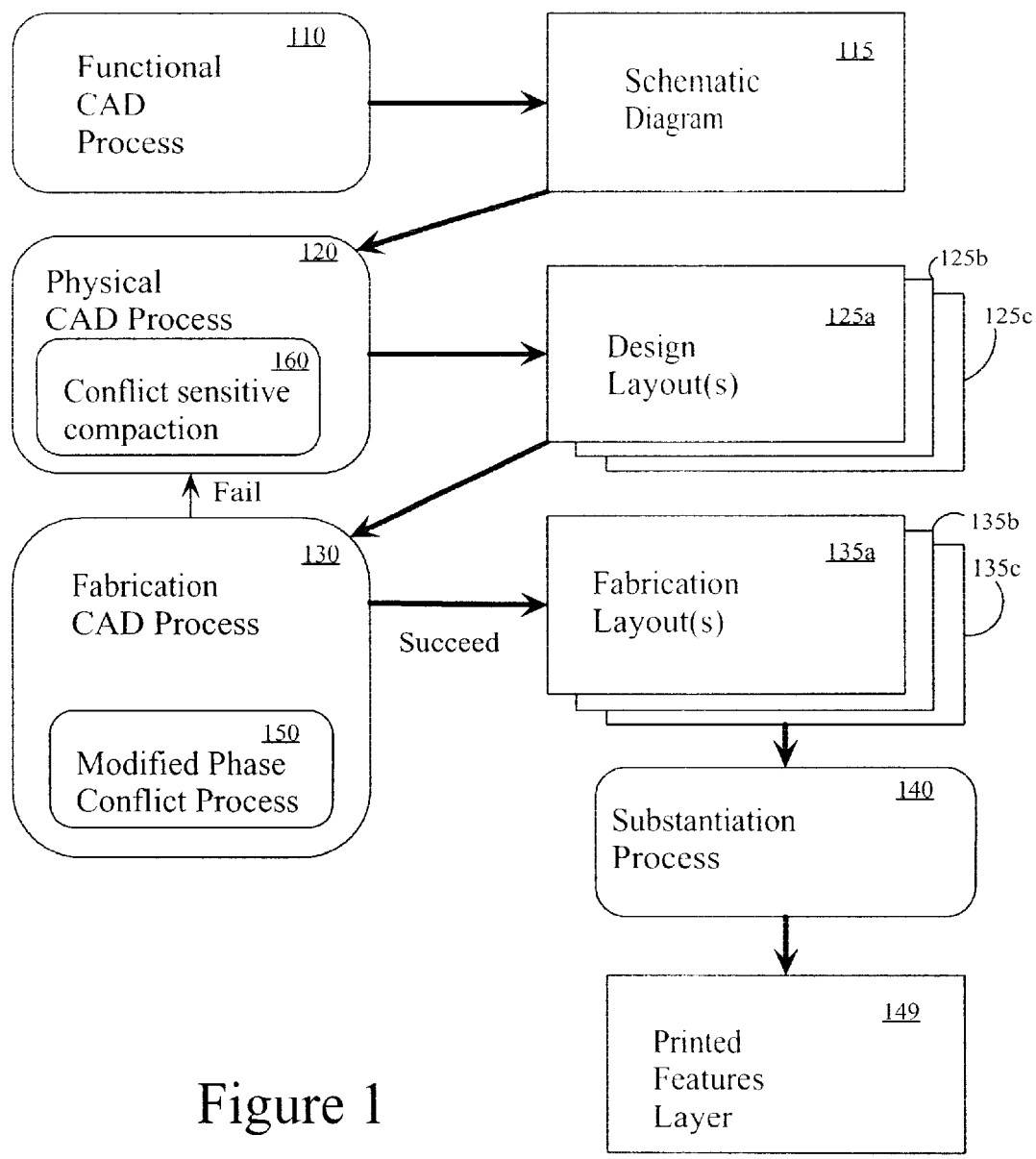
FIG. 1 is a block diagram showing the sequence of processes and layouts utilized in the formation of printed features layers according to one embodiment.

Techniques are provided for designing and fabricating printed features layers using a conflict sensitive compaction process 160 in the physical CAD process 120, and a modified phase conflict process 150 in the fabrication CAD process 130, as shown in FIG. 1. In the remainder of this section the relationship between the two techniques is described at a high level. In the following sections the modified phase conflict process, using incremental resolution of phase conflicts, is described in more detail. In subsequent sections, the conflict sensitive compaction techniques are described in more detail.

The conflict sensitive compaction process 160 uses information supplied by the fabrication CAD process 130 about the existence of one or more particular phase-shift conflicts in order to adjust the arrangement of elements and features in one or more design layouts 125.

The modified phase conflict process 150 separates the task of placing shifters, for example with a placement engine, from the task of assigning phases to those shifters. In particular, relative phases are assigned to shifters on a hierarchical unit basis, using a coloring engine. Coloring means assigning phase information to units, such as relative phases for pairs of shifters. With the relative phases so assigned, the modified phase conflict process 150 determines whether there is a phase-shift conflict within the unit. Absolute phases are not assigned until relative phases without phase-shift conflicts can be assigned to each unit in the hierarchy of the design layout.

If any unit has a phase-shift conflict that cannot be resolved by changing shifters or the relative phase assignments, then the modified phase conflict process 150 notifies the physical CAD process 120 of the phase-shift conflict and provides information about the particular phase-shift conflict. The fabrication design process does not proceed with subsequent units in the hierarchy. In this way, phase-shift conflicts are found and resolved incrementally, before time and computational resources are expended attempting to place shifters and assign phases to them for all the phase-shifted features in the entire design layout.

HIERARCHICAL LAYOUTS

Figure 2:
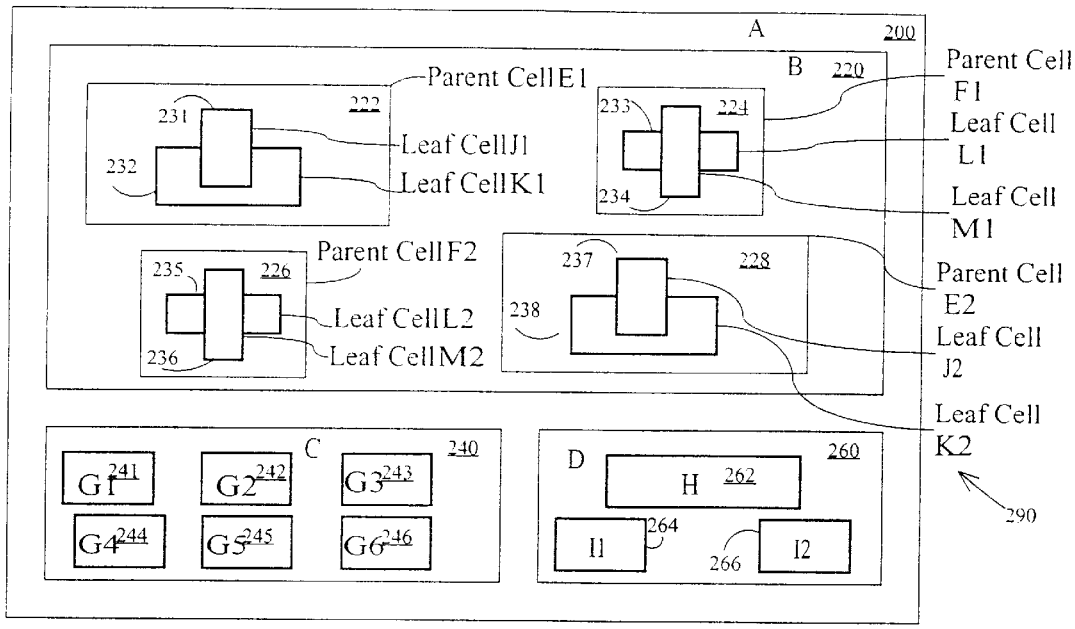
FIG. 2 is a plan view of an example design layout.
Figure 3:
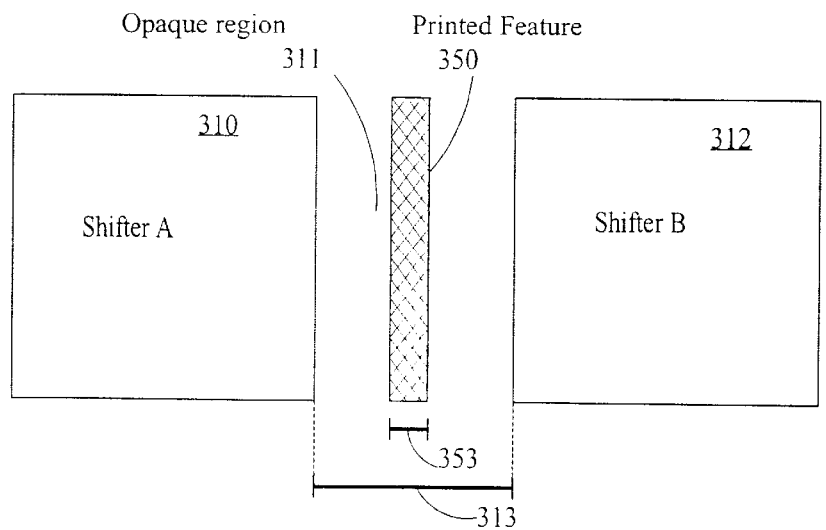
FIG. 3 is a plan view of two shifters on a mask and the resulting printed feature on the printed features layer.

A hierarchy can represent a layout. For example, as shown in FIG. 2, the circuit design layout 290 comprises a fmal cell, or hierarchical unit, A 200, which comprises sub-units B 220, C 240, and D 260 which are themselves parent cells for the units disposed in them. For example, parent cell C 240 comprises identical cells G1 241, G2 242, G3 243, G4 244, G5 245 and G6 246, and parent cell F1 224 comprises leaf cells L1 233 and M1 234 which comprise the primitive geometric structures illustrated in FIG. 2A. Parent cell E1 includes leaf cells J1 231 and K1 232; and parent cell E2 includes leaf cells J2 237 and K2 238. Parent cell F2 226 includes leaf cells L2 235 and M2 236.

Figure 5:
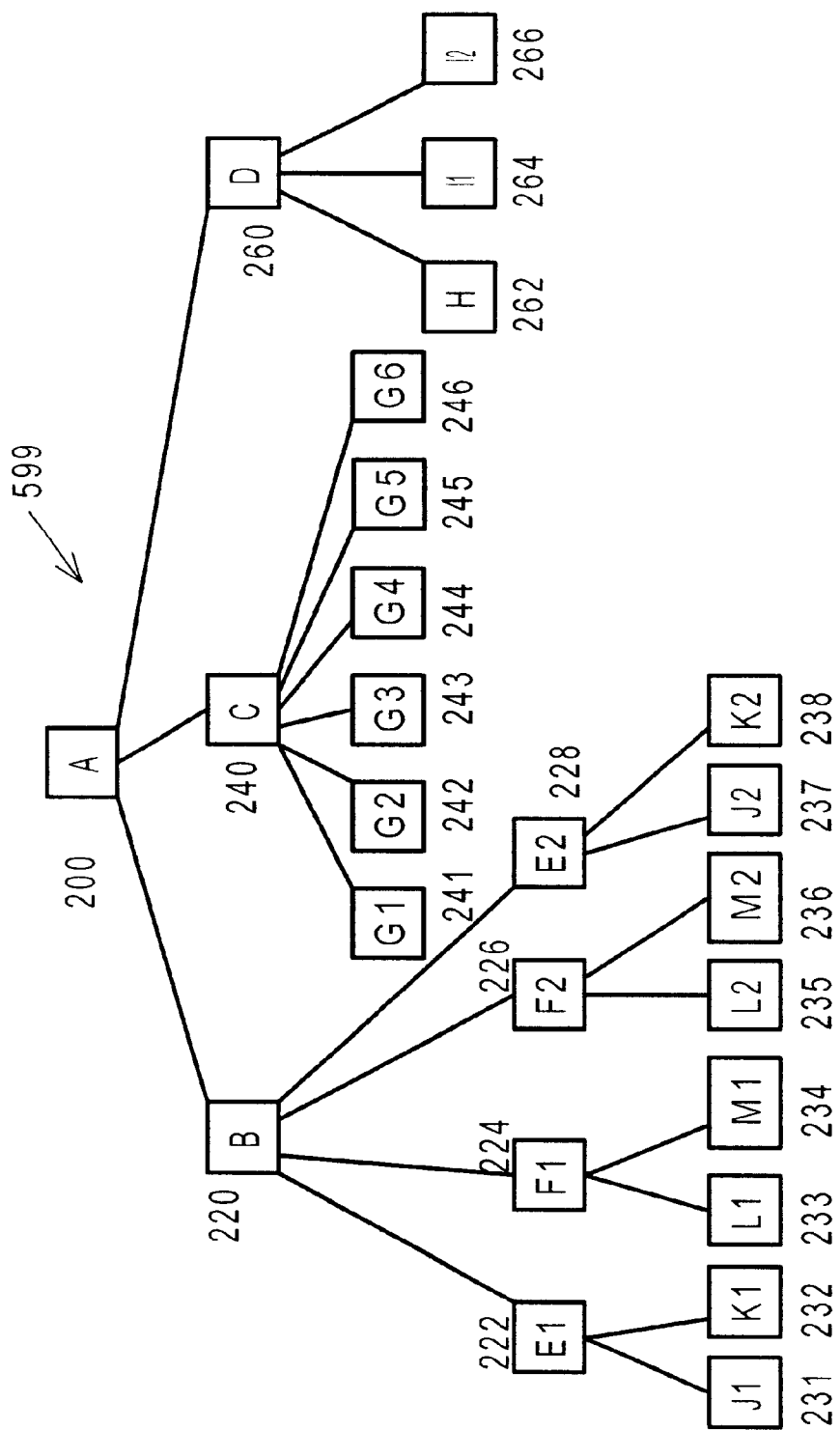
FIG. 5 is a diagram of the hierarchical tree representation of the design layout in FIG. 2.

The hierarchical tree layout 599, shown in FIG. 5, illustrates the described cells in a tree format with the leaf cells at the bottom of tree and with the final cell A 200 at the top of the tree. Each of the leaf cells is also sometimes referred to as the leaf node or a child cell, while each of the cells above the leaf nodes is sometimes referred to as a parent cell or simply a node. Any node can also be called a hierarchical unit of the design. The integrated circuit design layout 200 of FIG. 2 is provided simply to demonstrate the hierarchical nature of design layouts in general, and for integrated circuits in particular.

The items on a mask can also be represented as hierarchical units, according to a related pending U.S. patent application Ser. No. 09/154,397 entitled "Method and Apparatus for Data Hierarchy maintenance in a System for Mask Description," filed on Sep. 16, 1998, invented by Fang-Cheng Chang, Yao-Ting Wang and Yagyensh C. Pati.

THE MODIFIED PHASE CONFLICT PROCESS

The modified phase conflict process 150 operates incrementally on hierarchical units of the design layout. The described embodiment begins with a leaf cell and proceeds up the hierarchy to the root cell, but the process 150 can begin with any unit below the root cell. For example, if the design layout's hierarchy is represented by the tree in FIG. 5, the modified phase conflict process 150 of the described embodiment would first operate on one of the leaf cells, i.e., 231, 232, 233, 234, 235, 236, 237, 238, or 241, 242, 243, 244, 245, 246, or 262, 264, 266. The selection of the first leaf cell, and the progression through other leaf cells, can be performed in any way known in the art. If the first leaf cell is J1 231, the described embodiment would select as the next unit another leaf cell, e.g., K1, which is combined with J1 231 by the next higher node in the hierarchy, i.e., E1 222. After these units are processed, the described embodiment would process unit E1 222. However, before processing unit B 220, the described embodiment first processes the other units, or nodes, combined by unit B 220, i.e., F1 224, F2 226, and E2 228. Since each of these units have subunits, their subunits should be processed before the respective units. Thus, in the described embodiment, leaf cells L1 233 and M1 234 are processed in turn before processing unit F1 224.

In another embodiment, the first node processed on a branch may be any node in the hierarchy 299 below the root node A 200. However, if the first node selected is not a leaf cell, all the subunits in the first node are processed together. One or more other nodes are first processed on respective other branches in the tree. In the following discussion, the first node selected on any branch for processing is called a cell. For example, if B 220 is the first node processed on its branch, then all the nodes below B 220, i.e., 220–238, are included in a cell. Other cells are needed, in this example, for the remaining branches to nodes C and D and below. For example, node C may be processed first in its branch, making the nodes 240–246 one cell. In a contrasting example, the branch involving node D 260, first processes the leaf nodes, 262, 264 and 266, making those the cells on their branches.

In one embodiment of the invention, shifters are initially placed in a cell, and in subsequent hierarchical units the shifters are corrected or assigned relative phases or both, but are not initially placed.

Figure 4A:
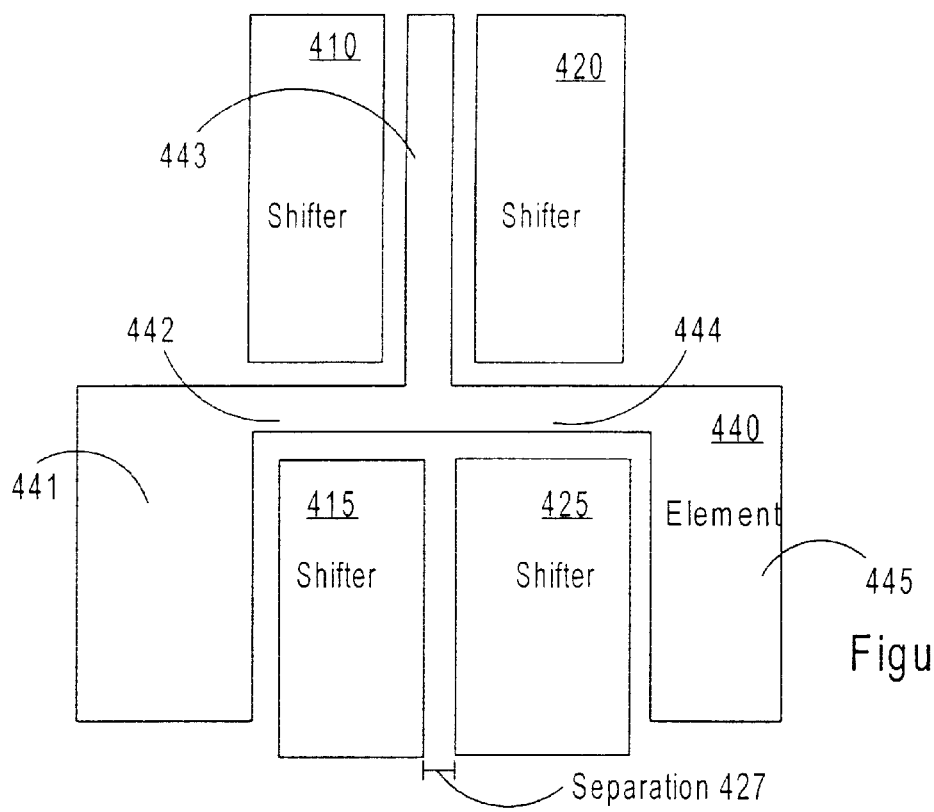
FIGS. 4A & 4B are plan views of example elements having features that employ shifters that lead to phase-shift conflicts.
Figure 6:
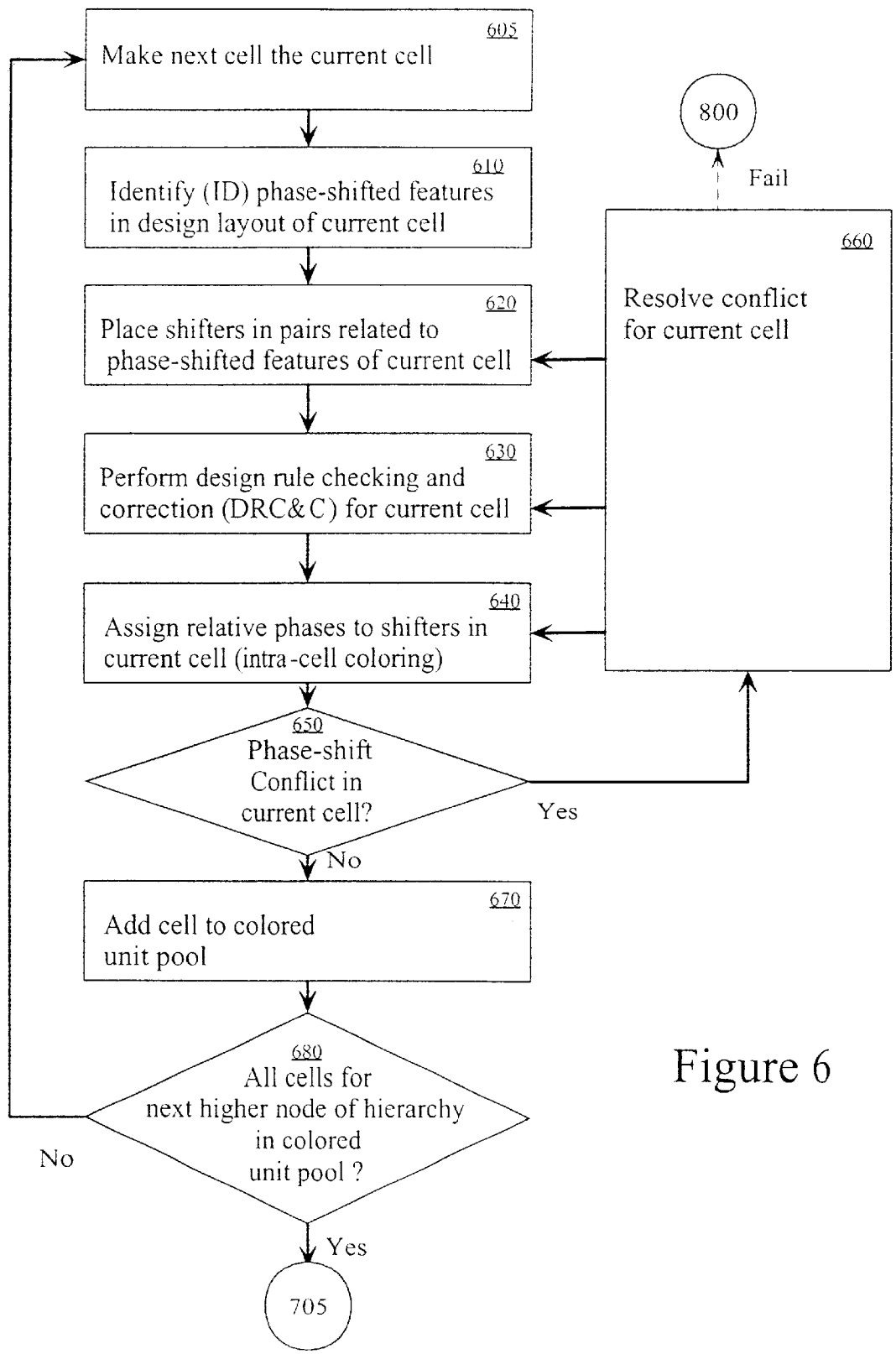
FIG. 6 is a flowchart illustrating the phase-shift conflict process at the cell level according to one embodiment.

FIG. 6 is a flowchart illustrating the phase-shift conflict process 150 at the cell level, according to one embodiment. This process can be executed in a computer system, such as the computer system shown in FIG. 10. In step 605 the process makes the next cell of the cells in the hierarchy the current cell for processing. In step 610 the process identifies shifted features in the current cell of the design layout. In step 620, the process places shifters in pairs, the shifter having shapes and positions related to the positions and shapes of the phase-shifted features in the current cell in ways known in the art. In step 630, the process performs design rules checking and correction (DRC&C) for the shifters of the current cell. For example, if step 620 placed shifters as shown in FIG. 4A, then the design rule that forbids spacing between two adjacent shifters from being smaller than a certain distance X would force the DRC&C step 630 to combine shifters 415 and 425 and derive a single shifter 430. The shifter 430 is derived from the initial shifters 415 and 425. In a trivial element of this process, shifters 410 and 420 are derived to be the same as their initial placement. In step 640, the process assigns relative phases to the shifters in the current cell—this is called intra-cell coloring. Using relative phases, for each shifter pair, the two separate shifters adjacent to a single phase-shifted feature are assigned a phase difference of 180 degrees. This step can be accomplished using ways known in the art, such as the standard graph traversal algorithm. In the graph-traversal algorithm, a phase-assignment graph is constructed in which each given shifter is a node and adjacent shifters that constrain the phase of the given shifter are represented by links. Two kinds of links are represented, an opposite phase link and a same phase link. An opposite phase link is indicated to form a critical, phase-shifted feature. A same phase link is employed when two shifters (nodes) are close together without an intervening critical phase-shifted feature. The links represent the relative phases without fixing an absolute phase. An example of a phase-assignment graph is given in more detail in a later section.

Unlike conventional fabrication layout design, this embodiment separates the placement of shifters in step 620, as performed by a placement engine, for example, from the assignment of phases to the shifters in step 640, as performed by a coloring engine providing relative phases for the shifters, for example. By assigning relative phases in step 640, rather than absolute phases, this embodiment does not fix the absolute phase of the shifters; but, instead, allows the relative phases to be switched as needed to resolved future phase conflicts before fixing the absolute phases of the shifters in this cell. This process makes it easy to swap the phases of the necessary shifter pairs in the cell with a single command or notation, if that turns out to be needed to resolve some future phase-shift conflict.

Figure 4B:
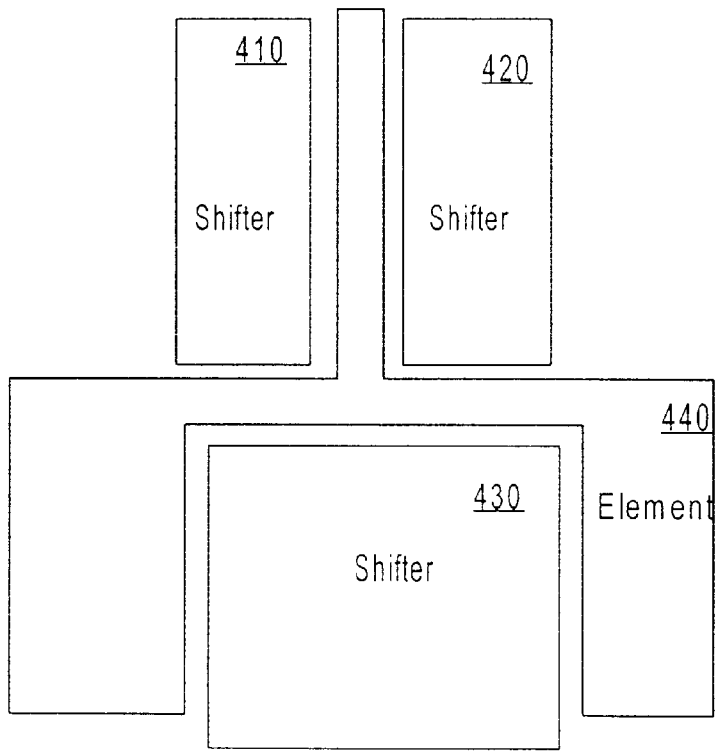

In step 650, the relative phases are used to determine whether there is a phase-shift conflict in the current cell. For example, FIG. 4A illustrates a feature 440 that leads to a phase-shift conflict as represented by FIG. 4B. This phase-shift conflict can be detected with the relative phases assigned to the shifters. Another common phase shift conflict arises with odd cycle shifters—a set of shifters in which an odd number of shifters are associated with closely spaced phase-shifted features.

Unlike conventional fabrication layout design processes, this embodiment detects a phase-shift conflict at the cell level, rather than after all shifters have been placed and assigned absolute phases for the whole design layout. Consequently, a phase-shift conflict resolution can be attempted at the level of the current cell, which is a simpler problem than resolving phase-shift conflicts for the entire design layout.

If no phase-shift conflict remains in the current cell, then control passes to step 670 in which the current cell is added to a pool of successfully colored hierarchical units. Units are successfully colored if relative phases can be assigned that do not cause phase-shift conflicts. The colored unit pool may be maintained in memory or on permanent storage device accessible to the fabrication layout design process 130. In step 680 of this embodiment, it is determined whether all the cells for the next higher node of the hierarchy are available in the colored unit pool. If they are, then processing can begin for the next higher node in the hierarchy. If all the cells needed by the next higher node in the hierarchy are not already in the colored unit pool, then another cell needed by the next higher node is made the current cell in step 605.

If it is determined in step 650 that there is a phase-shift conflict in the current cell, then control passes to step 660, which attempts to resolve the conflict for the current cell within the fabrication layout design process 130. It is assumed in this embodiment that the fabrication layout design process 130 can change the position or shape of shifters, consistent with the shifter design rules, and can change the relative or absolute phases of the shifters, but cannot change the position or shape of features that appear in the design layout 125 for a printed features layer 149. Step 660 includes any methods known in the art to resolve phase-shift conflicts within the fabrication layout design process. Known methods include replacing an offending shifter with a stored shifter that is differently positioned or shaped, breaking up odd cycle shifters by replacing one of the shifters in the combination with two separated shifters, and obtaining manual input from an operator to re-shape or re-position or break-up a shifter or to provide relative phase information for a shifter. Another method is to allow two opposite-phase shifters to produce a spurious feature, and then to expose the spurious feature in a different stage of the fabrication process to cause the removal of the spurious feature. The two opposite-phase shifters result either from splitting one shifter in two, or allowing two shifters to be positioned closer than a design rule limit without joining the two shifters.

Another method to resolve phase-shift conflicts within a hierarchical unit involves introducing one or more new variants of a standard cell in the hierarchical unit. Each variant has one or more pairs of shifters reversed from their phases in the standard cell. This method involves replacing a standard cell with one of its variants in the hierarchical unit.

If step 660 is able to modify the shifter layout for the cell, control passes to step 620 to place the shifters in the case in which a shifter shape has been changed. If step 660 also specified positions for the shifters, control returns to step 630 to perform DRC&C for the cell. If step 660 also overrules DRC&C, control will pass back to step 640 to assign relative phases. The new arrangement of shifters and phases is checked for phase-shift conflicts in step 650.

If step 660 is unable to provide different shifter shapes or positions, or if repeated changes to shifter shapes and positions do not remove all phase-shift conflicts in the current cell, then step 660 is unable to resolve the phase-shift conflict for the current cell, and step 660 fails. Upon failure of step 660 to resolve one or more phase-shift conflicts in the current cell, control passes to a point in the physical design process 120 represented by transfer point 800 in FIG. 6. The physical design process 120 then rearranges features in the design layout 125.

Figure 7:
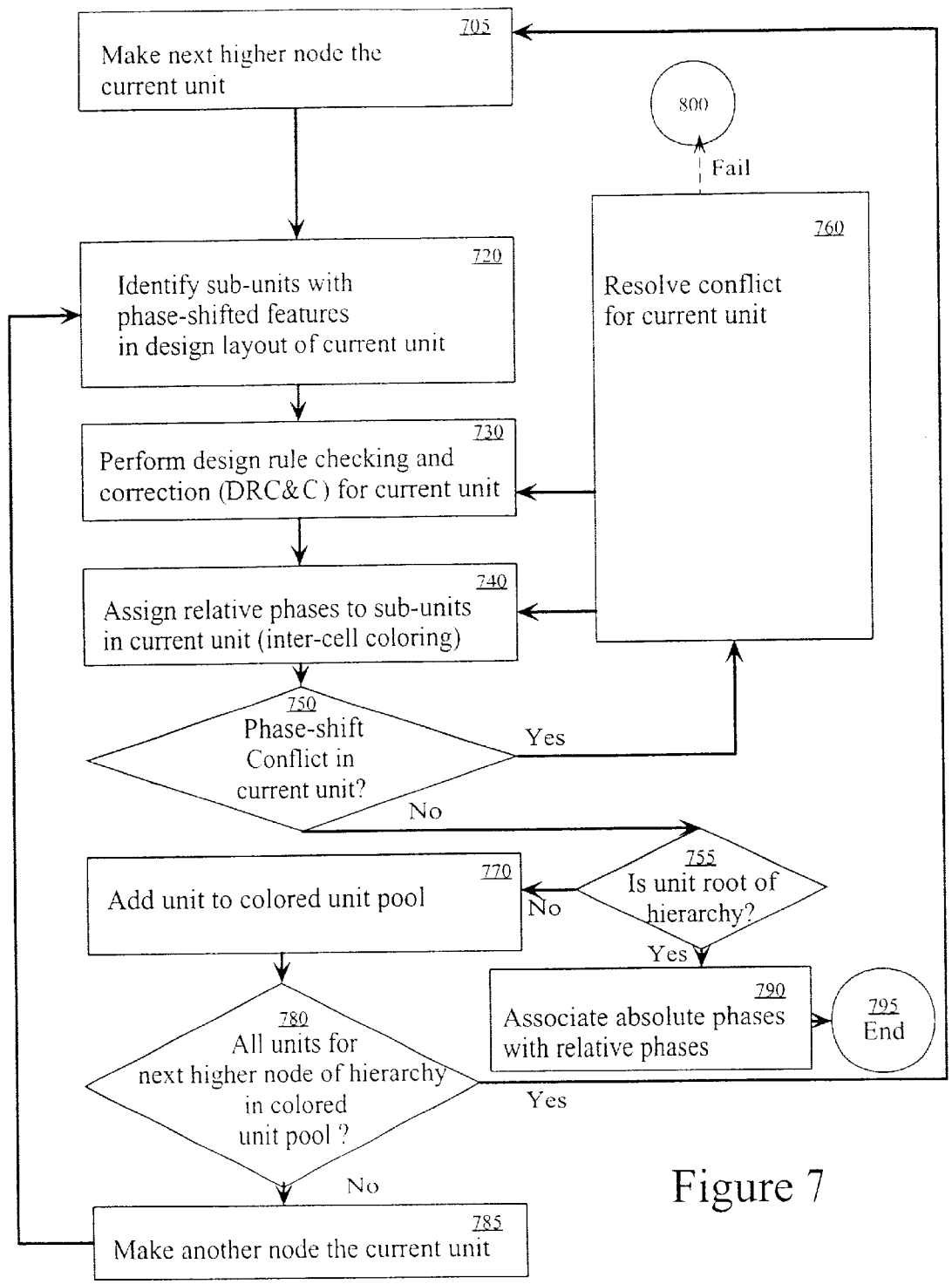
FIG. 7 is a flowchart illustrating the phase-shift conflict process at a hierarchical unit above the cell level according to an embodiment.

FIG. 7 is a flowchart illustrating the phase-shift conflict process 150 at a general hierarchical unit level, according to one embodiment of the present invention. At step 705 the process makes the next higher node the current unit, such as when all the cells within a parent node have been processed. If the general hierarchical unit is a cell first being processed, then step 705 can be skipped. In step 720 the process identifies subunits with phase-shifted features in the design layout of the current unit. If the current unit is the first cell being processed on its branch, then shifters have to be placed for the phase-shifted features, as shown in FIG. 6. However, if the current unit is made up of subunits that have already been processed, then the shifters for the phase-shifted features have already been initially placed.

In step 730, DRC&C is performed on the shifters for the current unit. During this step a shifter smaller than the allowed minimum width, or a spacing between two shifters that is smaller than the allowed minimum spacing X, will be discovered and corrected, for example.

In step 740, the shifters in all the subunits in the current unit will be assigned relative phases, not by reassigning the relative phase of all shifters in the unit, but by adjusting the relative phase between subunits, e.g., by recording that a first subunit is 180 degrees out of phase from a second sub-unit—this is called inter-cell coloring. In one embodiment, inter-cell coloring is accomplished by simply reversing the polarity of the needed relative phases of a subunit. This preserves the relative phases of all the shifters within the subunit. In another embodiment this is accomplished by adding a link between nearby shifters in the phase-assignment graph for this current hierarchical unit.

Unlike conventional fabrication layout design processes, this embodiment provides relative phase information separately from positioning the shifters. Moreover, this embodiment provides a way of incrementally building up the relative phase information from lower hierarchical unit levels all the way to the top level. Again, as above, by assigning relative phases in step 740, rather than absolute phases, this embodiment does not set the absolute phase of the shifters; but, instead, allows the relative phases to be switched as needed to resolve future phase conflicts in higher units in the hierarchy before fixing the absolute phases of the shifters in this unit. This embodiment makes it easy to swap the phases of all the shifters in the unit with a single command or notation, if it turns out to be needed to resolve some future phase-shift conflict at a unit higher in the hierarchy of the design layout.

In step 750, the relative phases are used to determine whether there is a phase-shift conflict in the current unit. Unlike conventional fabrication layout design processes, this embodiment detects a phase-shift conflict at the unit level, rather than after all shifters have been placed and assigned absolute phases for the whole design layout. Consequently, a shift conflict can be detected early. In addition the phase-shift conflict resolution can be attempted at the level of the current unit, which is a simpler problem than resolving phase-shift conflicts for the entire design layout.

If it is determined in step 750 that there is a phase-shift conflict in the current unit, then control passes to step 760, which attempts to resolve the conflict for the current unit within the fabrication layout design process 130. As in step 660 above, step 760 is not limited to any particular technique for resolving phase-shift conflicts within a fabrication layout design process. If step 760 is able to modify the shifter layout for the unit, control passes to step 730 to perform DRC&C for the unit. If step 760 involves a method that overrules a design rule usually applied during DRC&C, control will pass back to step 740 to assign relative phases. The new arrangement of shifters and phases is then checked for phase-shift conflicts in step 750.

If the methods applied in step 750 are unable to provide different shifter shapes or positions, or if repeated changes to shifter shapes and positions do not remove phase-shift conflicts in the current unit, then step 760 fails. Upon failure of the methods applied in step 760 to resolve phase-shift conflicts in the current unit, control passes to a point in the physical design process 120 represented by transfer point 800 in FIG. 7. The physical design process 120 then rearranges features in the design layout 125, if possible and permitted.

If no phase-shift conflict remains in the current unit, then control passes to step 755. If the current unit is the root unit of the hierarchy, then the fabrication layout design is complete and without phase-shift conflicts; thus the fabrication design process 130 has successfully produced fabrication layout 135. Step 755 determines whether the current unit is a root unit of the hierarchy. If it is determined in step 755 that the current unit is the root unit, then control passes to step 790. In step 790, absolute phases are associated with the relative phases assigned to each shifter in the fabrication layout 135, the fabrication layout 135 is stored, and the fabrication design process ends successfully at point 795.

If the current unit is not the root unit of the hierarchy, then control passes to step 770 in which the current unit is added to the pool of successfully colored units. Control then passes to step 780, in which it is determined whether all units for the next higher node in the hierarchy are already in the colored unit pool. If all units for the next higher node are already in the colored unit pool, then the next higher node is made the current unit, by passing control to step 705. If all units for the next higher node are not in the colored unit pool, then another node needed by the next higher node is made the current unit, in step 785.

In this way, hierarchical units with relative phases assigned, and with no phase conflicts, are accumulated in the colored units pool. The units in this pool represent resources that can be readily re-used in other designs, because they are known to be free of internal phase-shift conflicts.

CONFLICT SENSITIVE COMPACTION

Figure 8A:
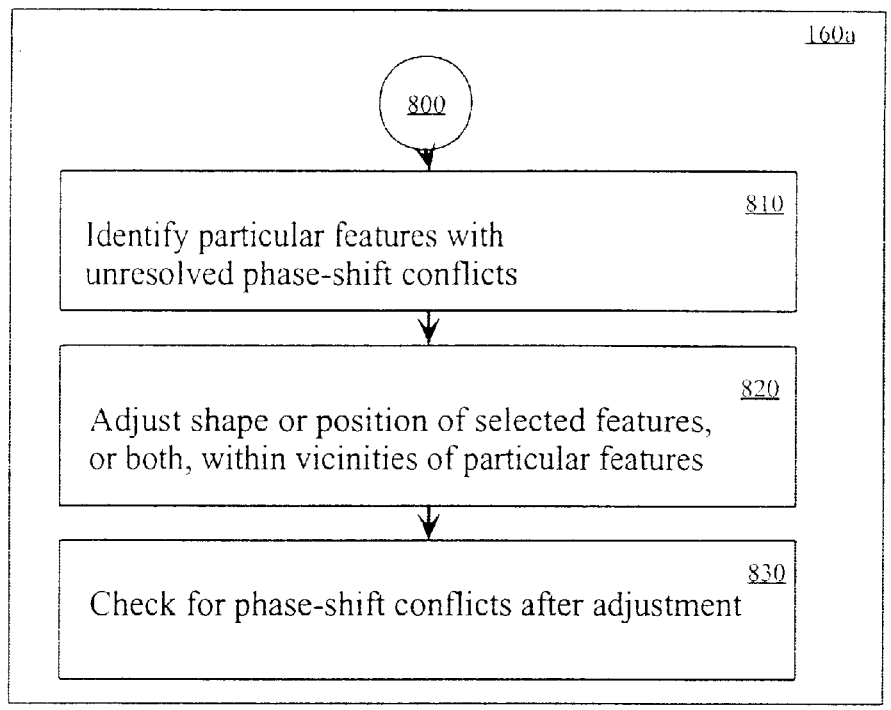
FIGS. 8A, 8B and 8C are flowcharts illustrating the steps for the modified design layout process according to embodiments.

The physical design process 120 is modified to include conflict sensitive compaction 160 in an embodiment of the invention. FIG. 8A is a flowchart illustrating steps for a modified design layout process according to one embodiment of the invention. In this embodiment, control passes to transfer point 800 when the fabrication design process is unable to resolve a phase-shift conflict. In step 810, the process identifies particular features with unresolved phase-shift conflicts based on information received from the fabrication design process 130. If a conventional fabrication design process were employed, this information first becomes available only for the entire design layout. However, in this embodiment, the information about a phase-shift conflict becomes available for the first hierarchical unit that encounters an irresolvable phase-shift conflict. Herein, an irresolvable phase-shift conflict indicates a phase-shift conflict that could not be resolved by the fabrication design process. In the described embodiment, the information includes identification of the hierarchical unit in which the irresolvable phase-shift conflict was found. In another embodiment, the information includes the amount of space needed to resolve the conflict with additional shifters. In another embodiment, the information includes a list of features linked by a loop in a phase-assignment graph with the feature having the phase-shift conflict.

In step 820, the process adjusts the design layout based on the information provided about the particular phase-shift conflicts, and produces an adjusted design layout, 125b. In one embodiment, the adjustment is confined to the features within the same hierarchical unit that encountered the irresolvable phase-shift conflict. In an alternative embodiment, the adjustment is confined to selected features within a given distance of the particular features identified as having unresolved phase-shift conflicts. The particular feature is included among the selected features. Unlike the conventional design process, which addresses phase-shift conflicts throughout the entire design layout, these embodiments employ the design process 120 to solve a much smaller problem, one confined to a single unit in the hierarchy of the design layout, or one confined to a given distance from the particular features identified with the phase conflict, or one confided to a subset of features logically related by a loop in a graphical representation of relationships among shifters.

Different procedures can be used to adjust features in the hierarchical or spatial vicinity of the phase-shift conflict. In one embodiment, the design layout in the vicinity is computed using the original design rules that produced the original design layout, such as the original process-specific design rules, if several viable layouts are produced by those design rules. In this case, it is suggested that a different viable layout be used than was used to produce the original layout. However, if this method is used, there is no significantly improved likelihood that the new design will avoid a phase conflict. In some embodiments, such as where several viable solutions occur, multiple potential solutions to a phase conflict are generated based on the logically associated features. For example, a different one of the associated features can be fixed in position for each different potential solution or set of potential solutions. The potential solutions are evaluated to produce a set of one or more values per solution. For example, the set of values includes the total area of the design associated with the potential solution design in one embodiment. In other embodiments, the set of values includes the number of features to move and the number of phase shift conflicts remaining. The potential solution providing a most favorable set of values is picked. For example the potential solution associated with the smallest area or fewest features moved or fewest remaining conflicts is picked.

If another viable solution is tried, one embodiment adds step 830 to place and color shifters according to the adjusted layout, and then check for phase-shift conflicts in the adjusted layout. If phase-shift conflicts are still found in the adjusted layout, then another layout is selected from the viable layouts provided by the original design rules. The process continues until a viable layout is found which does not produce a phase-shift conflict, or until the supply of viable options is exhausted.

Figure 8B:
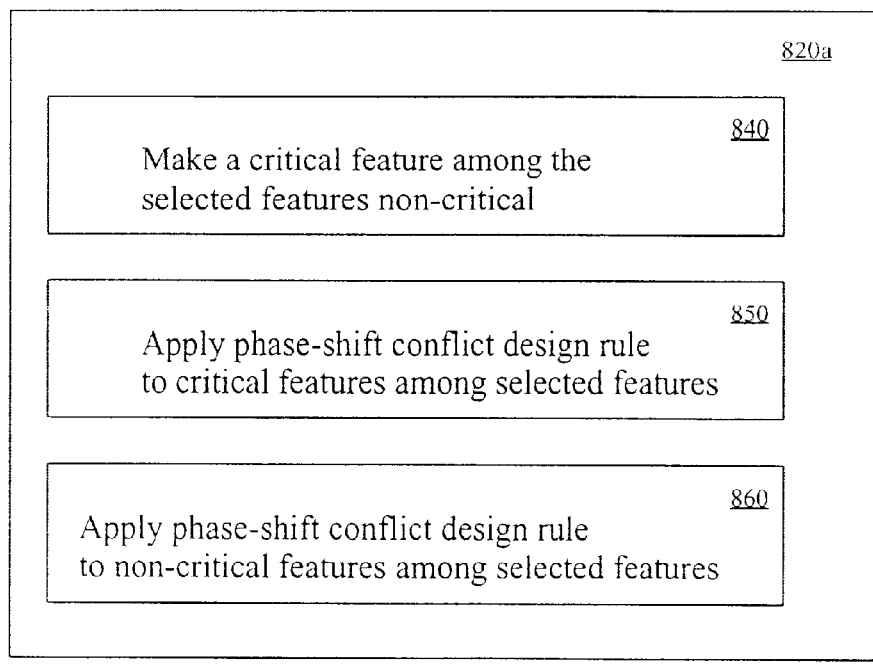

FIG. 8B shows the steps that are used in an alternative embodiment of step 820, designated step 820a, to adjust selected features within the vicinity of phase-shift conflicts.

In step 840, a critical feature among the selected features is made non-critical. Herein a critical feature is one that employs phase shifting; thus a non-critical feature is one that does not employ phase shifting. The ability of an adjustment making a critical feature non-critical to remove phase-shift conflicts is illustrated in FIGS. 9A and 9B.

Figure 9A:
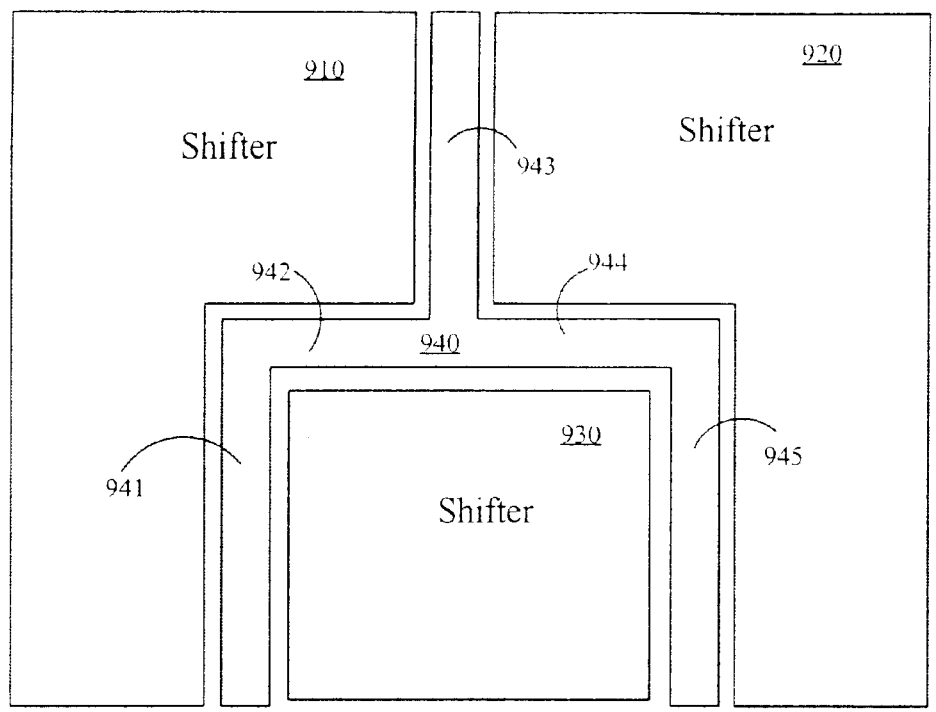
FIGS. 9A, 9B and 9C show plan views of elements of a printed features layer adjusted according to the design layout process of embodiments.
Figure 9B:
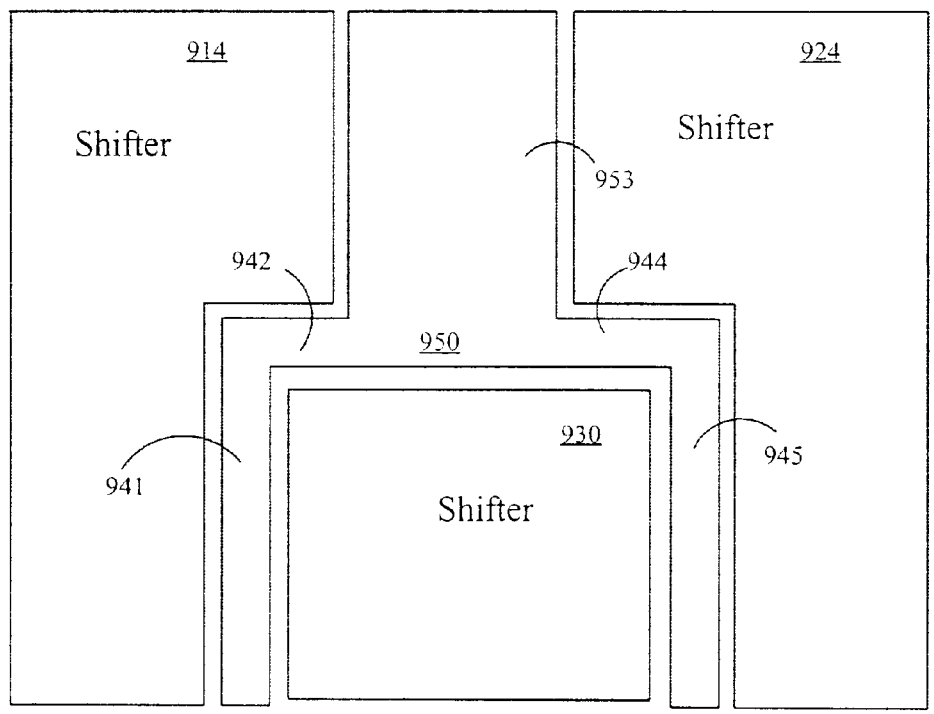

FIG. 9A shows an element 940 with five critical features 941, 942, 943, 944 and 945. Shifters 910 and 920 have opposite phases to form critical feature 943. This element leads to a phase-shift conflict because shifter 930 cannot simultaneously have opposite phase from both shifters 910 and 920. This phase-shift conflict was not resolvable by the fabrication layout design process because there was no room to insert another shifter or split shifter 930. According to this embodiment, feature 943 can be made non-critical. In this case, illustrated in FIG. 9B, non-critical feature 953 replaces critical feature 943 in element 950. As a consequence, shifters 910 and 920 can be replaced by shifters 914 and 924 spaced farther apart. In addition, there is no longer an inducement for shifters 914 and 924 to have opposite phase. When placed and colored in the fabrication design process, shifters 914 and 924 may be given the same phase, and shifter 930 may assume an opposite phase to both, thus resolving the phase-shift conflict.

It is appropriate to have new design rules that demand more space for placing features if such design rules are applied only in the context of phase-shift conflicts, because the benefit of removing the phase-shift conflict is considered worth the expenditure of extra layout area. Sample new design rules include placing edges farther apart on features in the vicinity of an irresolvable phase-shift conflict, and placing critical features father apart in the vicinity of an irresolvable phase-shift conflict. In step 850, new design rules applicable in phase-shift conflict situations are applied to critical features among the selected features. In step 860, other new design rules applicable in phase-shift conflict situations are applied to non-critical features among the selected features. Steps 850 and 860 are separate to allow the new phase-shift conflict design rules to be different for critical features and for non-critical features.

Figure 9C:
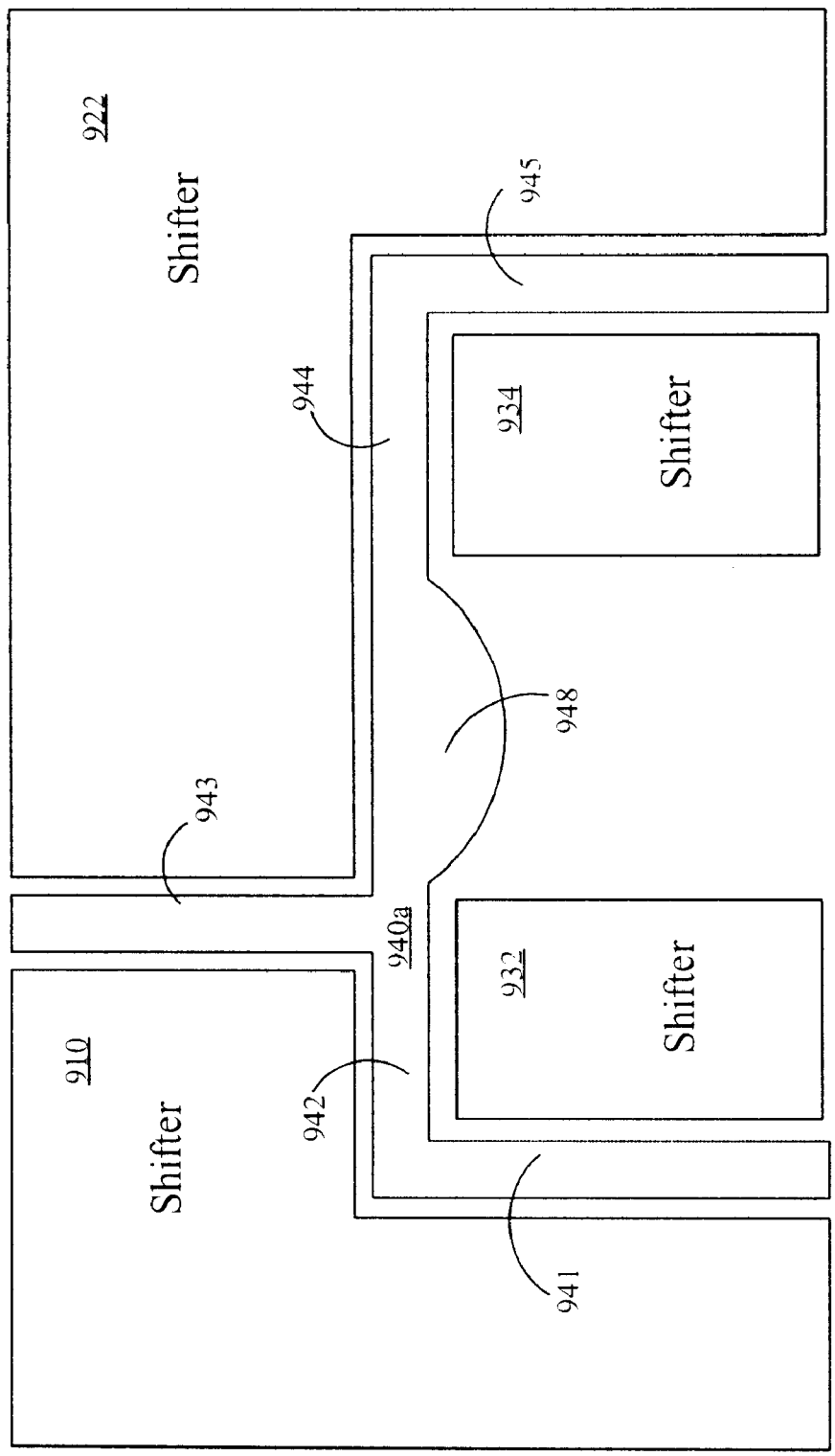

FIG. 9C illustrates how new design rules for critical features in the vicinity of a phase-shift conflict can resolve a phase-shift conflict. In this case, the phase-shift conflict caused by the element 940 in FIG. 9A, is communicated by the fabrication design process 130 to an embodiment of process 160a that includes step 850. Based on the information about the phase-shift conflict, in step 850, the process applies a new design rule calling for greater separation between critical features than called for in the original design rules. This causes features 945 and 944 to be moved further away from features 941, 942 and 943 in the adjusted design layout, as shown in FIG. 9C. With this arrangement, shifter 930 can be replaced by two separate shifters 932 and 934, which are far enough apart to have opposite phases from each other. With the extra space in this arrangement of shifters, the coloring engine can assign shifters 910 and 934 a first phase, and assign shifters 932 and 922 the opposite phase. Then phase shifted feature 943 can be produced by the opposite phases of shifters 910 and 922. Simultaneously, phase-shifted features 942 and 941 can be produced by the opposite phases of shifters 910 and 932; while phase-shifted features 944 and 945 can be produced by the opposite phases of shifters 922 and 934. The resulting element 940a includes a non-critical feature 948 between the critical features 942 and 944 in the gap caused by separating shifters 932 and 934.

A characteristic of the new design rules is the expected increase in layout area associated with the adjusted layout compared to the original layout. For example, the layout area associated with FIG. 9C is greater than layout area associated with FIG. 9A. It is possible that the physical layout design process can compensate for this increased area by the rearrangement of other features so that the total area for a cell or hierarchical unit of the design layout is not increased. In a sense, the cell or unit is re-compacted to accumulate space in the vicinity of the features associated with an irresolvable phase conflict. This accumulation of space or increase in layout area or both is herein termed reverse compaction.

Figure 8C:
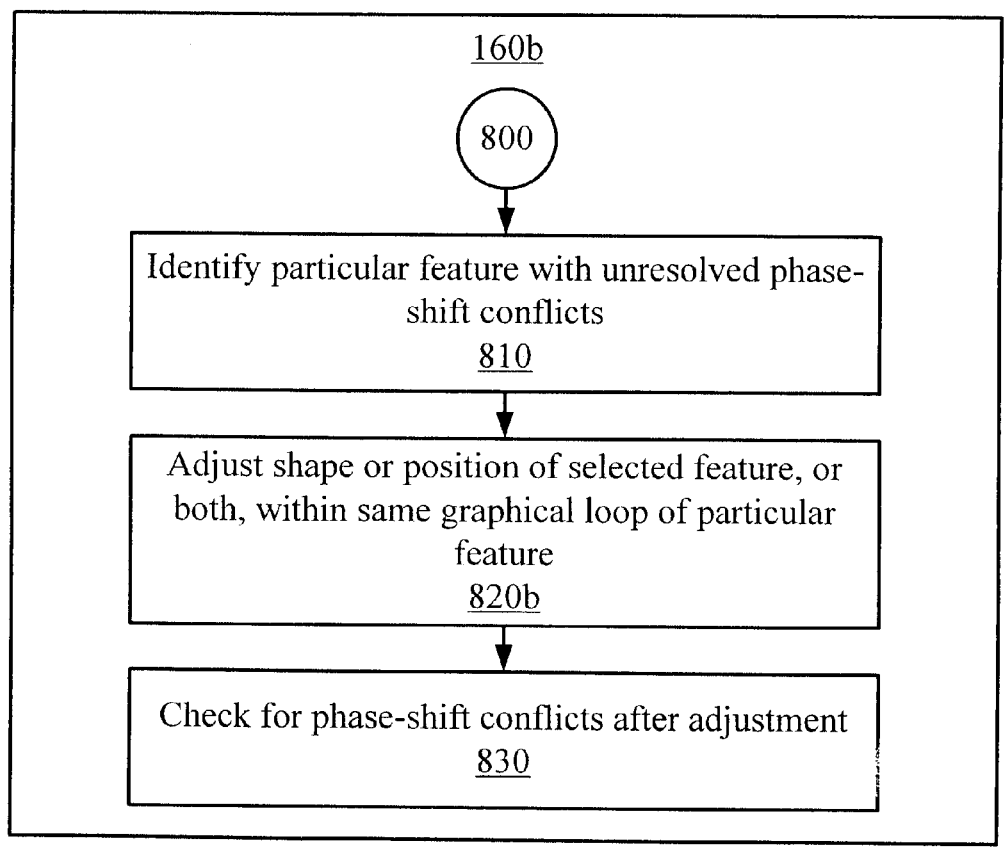

FIG. 8C is a flowchart illustrating steps for a modified design layout process according to another embodiment of the invention. As in FIG. 8A, control passes to transfer point 800 when the fabrication design process is unable to resolve a phase-shift conflict. In step 810, the process identifies particular features with unresolved phase-shift conflicts based on information received from the fabrication design process 130. In this embodiment, the information includes a list of features in the same graphical loop of a phase-assignment graph.

In step 820b, the process adjusts the design layout based on the information if provided about the particular phase-shift conflicts, and produces an adjusted design layout, 125b. In this embodiment, the adjustment is confined to features in the same graphical loop of related shifters, regardless of whether these features are neighbors or whether the features are within a specified distance of the irresolvable phase-shift conflict, or even whether they are in the same hierarchical subunit. In the described embodiment, the loop includes shifters in the same hierarchical subunit. The particular feature is included among the selected features. If this method is used, there is a significantly improved likelihood that the new design will avoid a phase conflict. If a critical feature is moved, however, there is a chance that a shifter is placed close to another shifter that can lead to a phase-shift conflict. Therefore, another embodiment using this method also adds step 830 to place and color shifters according to the adjusted layout, and then check for phase-shift conflicts in the adjusted layout. If phase-shift conflicts are still found in the adjusted layout, then another of the selected features is made modified. The process continues until a modification is found which does not produce a phase-shift conflict, or until the list of features on the same graphical loop is exhausted. The steps to adjust selected features shown in FIG. 8B for step 820a may also be used in step 820b. An example of this embodiment is illustrated with respect to FIGS. 9D, E and 9F.

Figure 9D:
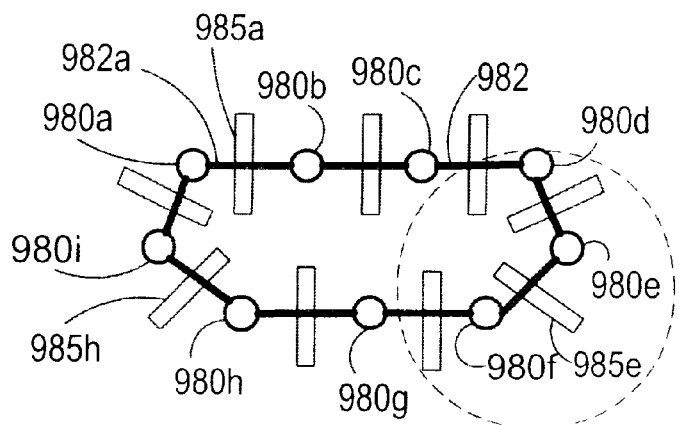
FIG. 9D shows a phase assignment graph associated with a hierarchical unit having a phase shift conflict.

FIG. 9D shows nine critical features 985 and a corresponding phase assignment graph. The phase assignment graph-is made up of nodes 980 representing shifters and links. In this example, each link 982 is an opposite phase link, connecting shifters that have opposite phases to produce the nine critical features. For example, link 982a indicates that the shifter at node 980a and the shifter at node 980b have opposite phases to form the critical feature 985a. This phase assignment graph is an example of an odd-cycle graphical loop that constitutes a detectable phase-conflict. To illustrate the conflict, assume that the shifter at node 980a is given a first phase value (either 0 or π). Then the shifters at nodes 980b and 980i have the second phase value, and the shifters at nodes 980c and 980h have the first phase value, and the shifters at nodes 980d and 980g have the second phase value, and the shifters at nodes 980e and 980f have the first phase value. This leads to a phase-shift conflict at 985e, because opposite phases are needed in the shifters at nodes 980e and 980g to form the critical feature 985e, yet the shifters at nodes 980e and 980f have the same phase. It is assumed that this phase-shift conflict was not resolvable by the fabrication layout design process because there was no room to insert another shifter or split shifters at either node 980e or 980f.

According to this embodiment, any feature formed by the shifters on the graphical loop of FIG. 9D may be moved or made non-critical to resolve this conflict. It is not necessary that that the adjusted feature be within a certain distance of the feature having the conflict. For example, it is not necessary that the adjusted feature be within circle 987 centered on critical feature 985e. It is also not necessary that the adjusted feature be within the same hierarchical subunit of the feature having the conflict. For example, the graphical loop of FIG. 9D may span several hierarchical subunits, such as parent cells E1, F1, E2 and F2 of FIG. 2.

Figure 9E:
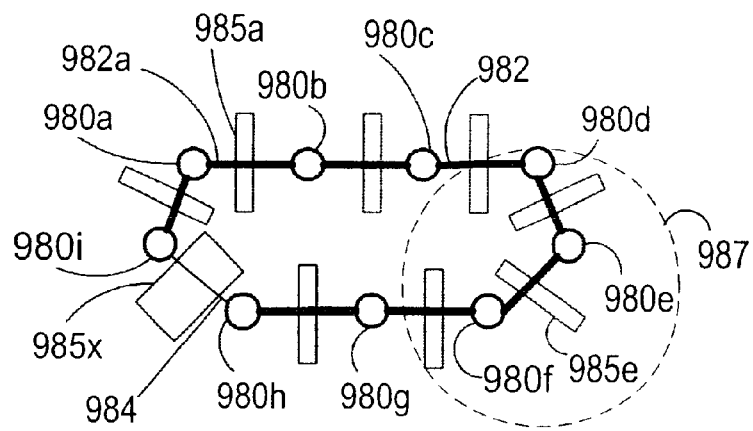
FIG. 9E shows a phase assignment graph associated with the hierarchical unit that resolves the phase conflict according to one embodiment.

For example, as illustrated in FIG. 9E, non-critical feature 985x replaces critical feature 985h. As a consequence, shifters at nodes 980i and 980h can have the same phase value, resolving the phase shift conflict on the loop. Shifter having the same phase are indicated by a different link 984, indicated in FIG. 9E by the thin line segment. Effectively, shifters at nodes 980i and 980h can be combined, reducing the number of shifters to 8 and eliminating the odd-cycle graphical loop. If the shifters do not form a critical feature and are far enough apart, no link at all needs to connect them and each is free to assume any value. If this were the case, no link would connect nodes 980h and 980i. Note that the feature adjusted is neither in the same hierarchical subunit nor within the circle 987 centered on the particular feature 985e originally identified as having the unresolved phase-shift conflict.

Figure 9F:
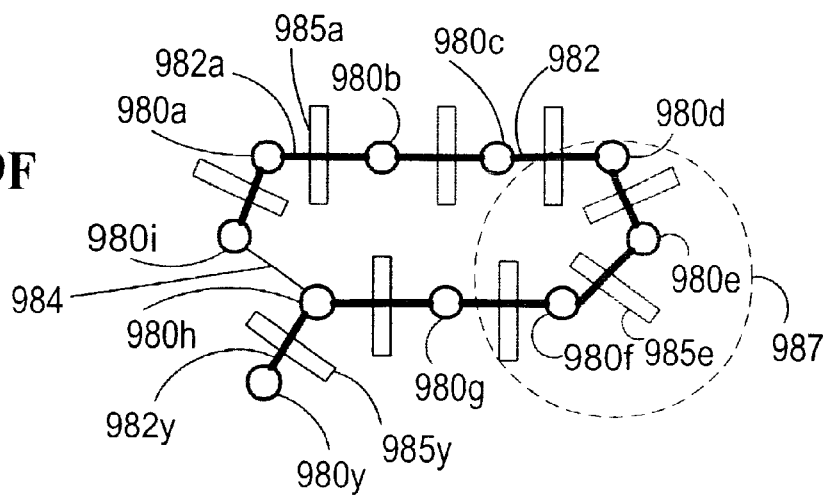
FIG. 9F shows a phase assignment graph associated with the hierarchical unit that resolves the phase conflict according to another embodiment.

FIG. 9F illustrates movement of an adjusted feature can resolve a phase-shift conflict. In this case, critical feature 985h in FIG. 9D is replaced by critical feature 985y in FIG. 9F. Effectively, critical feature 985h is moved to the position of critical feature 985y. It is assumed that critical feature 985h is moved because there is more room in its neighborhood than in the neighborhood of the other features connected by the graphical loop. Alternatively, it is moved because it is easier to accumulate space around it during reverse compaction. To form critical feature 985y, a new shifter is placed at node 980y, adding a tenth shifter to the graph, and is linked with an opposite phase link 982y. Since no critical feature is positioned between the shifters at nodes 980h and 980i, these shifters can have the same phase value. If the shifters are far enough apart, no link at all needs to connect them and each is free to assume any value. If this were the case, no link would connect nodes 980h and 980i. In either case, the phase-shift conflict on the loop is resolved. Note that the feature adjusted is neither in the same hierarchical subunit nor within the circle 987 centered on the particular feature 985e originally identified as having the unresolved phase-shift conflict.

The conflict sensitive compaction process depicted in FIG. 1 includes any adjustment in layout based on phase-shift conflict information, such as reverse compaction and the selection of alternative viable layouts, whether the adjustment be on the level of the entire design layout or on the level of any hierarchical subunit of it.

In one embodiment, electrical constraints are also checked during the design adjustment process through the use of a layout modification tool. An example of a layout modification tool that checks electrical constraints is the abraCAD™ tool, available from CADABRA DESIGN SYSTEMS™, a NUMERICAL TECHNOLOGIES™ company.

In the described embodiment, the modified phase conflict process 150, and the conflict sensitive compaction process 160, are implemented on a computer system with one or more processors. User input is employed in some embodiments.

HARDWARE OVERVIEW

Figure 10:
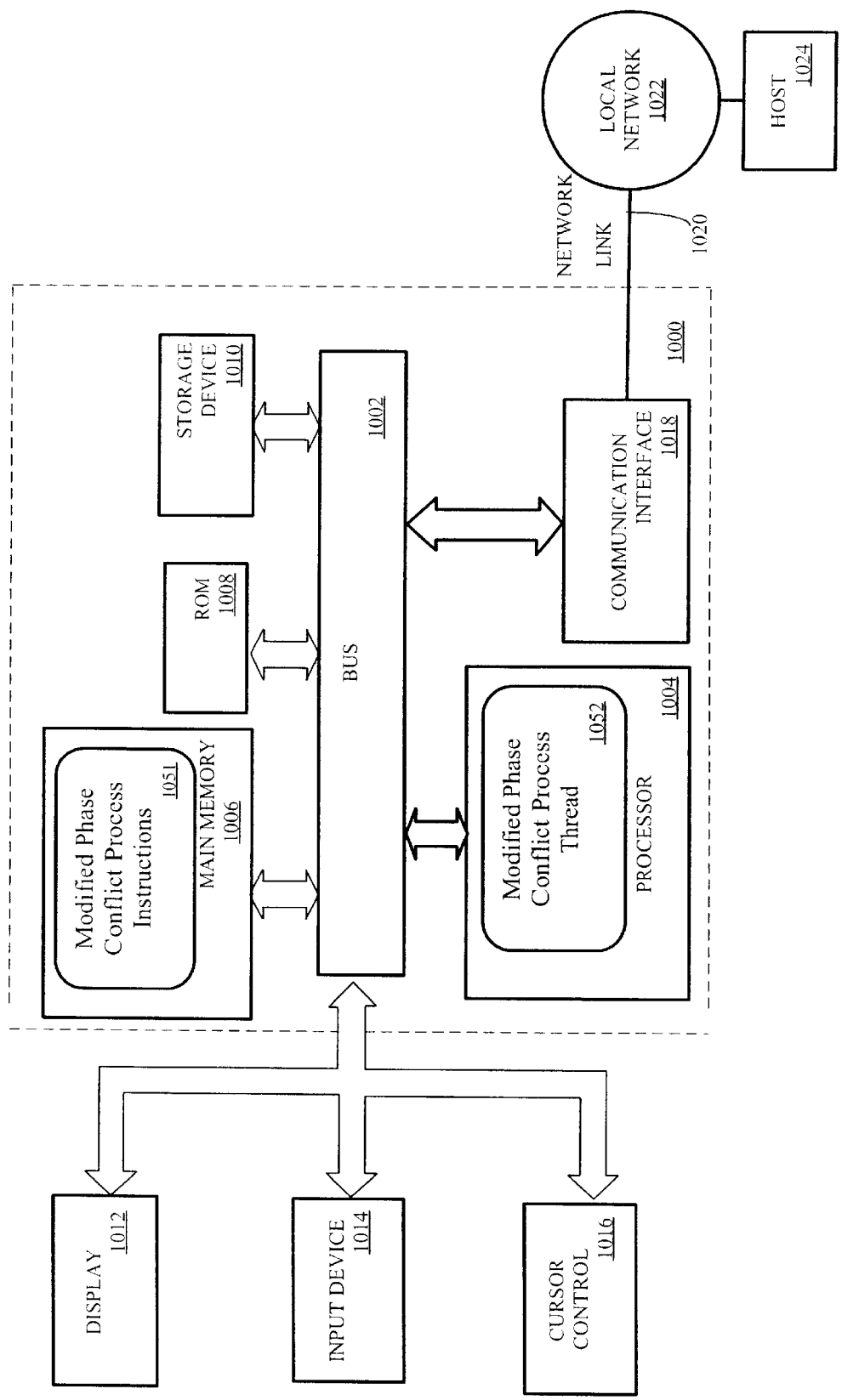
FIG. 10 is a block diagram of a computer system according to one embodiment.

FIG. 10 is a block diagram that illustrates a computer system 1000 upon which an embodiment of the invention is implemented. Computer system 1000 includes a bus 1002 or other communication mechanism for communicating information, and a processor 1004 of one or more processors coupled with bus 1002 for processing information. Computer system 1000 also includes a main memory 1006, such as a random access memory (RAM) or other dynamic storage device, coupled to bus 1002 for storing information and instructions to be executed by processor 1004. Main memory 1006 also may be used for storing temporary variables or other intermediate information during execution of instructions to be executed by processor 1004. Computer system 1000 further includes a read only memory (ROM) 1008 or other static storage device coupled to bus 1002 for storing static information and instructions for processor 1004. A storage device 1010, such as a magnetic disk or optical disk, is provided and coupled to bus 1002 for storing information and instructions.

Computer system 1000 may be coupled via bus 1002 to a display 1012, such as a cathode ray tube (CRT), for displaying information to a computer user. An input device 1014, including alphanumeric and other keys, is coupled to bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane.

The invention is related to the use of computer system 1000 for producing design layouts and fabrication layouts According to one embodiment of the invention, layouts are provided by computer system 1000 based on processor 1004 executing one or more sequences of one or more instructions contained in main memory 1006. For example, the modified phase conflict process runs as a thread 1052 on processor 1004 based on modified phase conflict process instructions 1051 stored in main memory 1006. Such instructions may be read into main memory 1006 from another computer-readable medium, such as storage device 1010. Execution of the sequences of instructions contained in main memory 1006 causes processor 1004 to perform the process steps described herein. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 1004 for execution. Such a medium may take many forms, including but not limited to, non-volatile media, volatile media, and transmission media. Non-volatile media includes, for example, optical or magnetic disks, such as storage device 1010. Volatile media includes dynamic memory, such as main memory 1006. Transmission media includes coaxial cables, copper wire and fiber optics, including the wires that comprise bus 1002. Transmission media can also take the form of acoustic or light waves, such as those generated during radio-wave and infra-red data communications.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1004 for execution. For example, the instructions may initially be carried on a magnetic disk of a remote computer. The remote computer can load the instructions into its dynamic memory and send the instructions over a telephone line using a modem. A modem local to computer system 1000 can receive the data on the telephone line and use an infra-red transmitter to convert the data to an infra-red signal. An infra-red detector can receive the data carried in the infra-red signal and appropriate circuitry can place the data on bus 1002. Bus 1002 carries the data to main memory 1006, from which processor 1004 retrieves and executes the instructions. The instructions received by main memory 1006 may optionally be stored on storage device 1010 either before or after execution by processor 1004.

Computer system 1000 also includes a communication interface 1018 coupled to bus 1002. Communication interface 1018 provides a two-way data communication coupling to a network link 1020 that is connected to a local network 1022. For example, communication interface 1018 may be an integrated services digital network (ISDN) card or a modem to provide a data communication connection to a corresponding type of telephone line. As another example, communication interface 1018 may be a local area network (LAN) card to provide a data communication connection to a compatible LAN. Wireless links may also be implemented. In any such implementation, communication interface 1018 sends and receives electrical, electromagnetic or optical signals that carry digital data streams representing various types of information.

Network link 1020 typically provides data communication through one or more networks to other data devices. For example, network link 1020 may provide a connection through local network 1022 to a host computer 1024. Local network 1022 uses electrical, electromagnetic or optical signals that carry digital data streams. The signals through the various networks and the signals on network link 1020 and through communication interface 1018, which carry the digital data to and from computer system 1000, are exemplary forms of carrier waves transporting the information.

Computer system 1000 can send messages and receive data, including program code, through the network(s), network link 1020 and communication interface 1018.

The received code may be executed by processor 1004 as it is received, and/or stored in storage device 1010, or other non-volatile storage for later execution. In this manner, computer system 1000 may obtain application code in the form of a carrier wave.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method for forming a design layout including phase-shifted features, the method comprising:

receiving information about a particular phase-shift conflict in a first physical design layout, wherein the information indicates one or more features logically associated with the particular phase-shift conflict;

adjusting the first physical design layout based on the information to produce a second design layout; and generating a phase-assignment graph that logically associates the one or more features with the particular phase-shift conflict, wherein:

a link on the phase assignment graph connects a node corresponding to a shifter to an adjacent node corresponding to an adjacent shifter when a phase value of the shifter constrains a phase value of the adjacent shifter; and each feature of the one or more features is associated with a shifter corresponding to a node connected through one or more links on the phase assignment graph to a particular node corresponding to a particular shifter involved in the particular phase-shift conflict.

2. The method of claim 1, wherein said adjusting is performed on the first physical design layout to a selected feature of the one or more features.

3. The method of claim 1, the adjusting step further comprising performing reverse compaction to consolidate empty space for the second design layout.

4. The method of claim 3, wherein the empty space is consolidated for the second design layout around a location of a selected feature of the one or more features.

5. The method of claim 4, wherein:
the method further comprises the step of determining that the selected feature is a critical feature that employs phase shifting; and
the adjusting step further comprises moving the selected feature into the empty space consolidated around the location of the selected feature.

6. The method of claim 1, wherein:
an hierarchical cell is an hierarchical unit in which shifters are initially placed; and
the one or more features include a feature in a different hierarchical cell from an hierarchical cell having the particular phase-shift conflict.

7. The method of claim 1, wherein:
the information relates to a phase-shift conflict within a particular hierarchical unit of the first physical design layout; and
said adjusting is performed on the first physical design layout in a vicinity of the particular hierarchical unit.

8. A method for forming a design layout including phase-shifted features, the method comprising:
receiving information about a particular phase-shift conflict in a first physical design layout,
wherein the information indicates one or more features logically associated with the particular phase-shift conflict; and
adjusting the first physical design layout based on the information to produce a second design layout,
wherein the one or more features include a feature not within a predetermined vicinity of the particular phase-shift conflict.

9. A method for forming a design layout including phase-shifted features, the method comprising:
receiving information about a particular phase-shift conflict in a first physical design layout,
wherein the information indicates one or more features logically associated with the particular phase-shift conflict; and
adjusting the first physical design layout based on the information to produce a second design layout,
wherein the phase-shift conflict could not be resolved in a fabrication layout design process that controls a location and a phase value of a shifter and does not control a location of a phase-shifted feature, and
wherein the information is received from the fabrication layout design process.

10. The method of claim 9, the adjusting step further comprising applying one or more new design rules for reducing phase-shift conflicts, wherein the new design rules are different from original design rules applied to produce the first physical design layout.

11. The method of claim 10, wherein:
the information identifies a particular feature in the first physical design layout related to the phase-shift conflict; and
the step of applying one or more new design rules is performed on a selected feature in a vicinity of the particular feature on the first physical design layout.

12. The method of claim 10, wherein:
the one or more new design rules includes placing edges apart at least a new distance; and
the new distance is greater than a original distance allowed in the original design rules.

13. The method of claim 9, said adjusting further comprising selecting an alternative design layout satisfying original design rules used to produce the first physical design layout, the alternative design layout being different than the first physical design layout.

14. The method of claim 9, said adjusting further comprising the steps of:
generating multiple potential solutions to a phase conflict based on the logically associated features;
evaluating the multiple potential solutions; and
picking a particular solution of the multiple potential solutions, the particular solution having a most favorable value produced during said step of evaluating.

15. The method of claim 9, further comprising:
determining whether there is a phase-shift conflict in the second design layout; and
if there is a phase-shift conflict, then providing information about the phase-shift conflict, and returning to the adjusting step.

16. The method of claim 9, the adjusting step further comprising changing a critical feature that employs phase shifting to a non-critical feature that does not use phase shifting.

17. A method for forming a design layout including phase-shifted features, the method comprising:
receiving information about a particular phase-shift conflict in a first physical design layout,
wherein the information indicates one or more features logically associated with the particular phase-shift conflict;
adjusting the first physical design layout based on the information to produce a second design layout;
assigning relative phases to shifters positioned based on phase-shifted features in the second design layout;
determining whether there is a phase-shift conflict in the second design layout; and
if there is a phase-shift conflict, then providing information about the phase-shift conflict, and returning to the adjusting step.

18. A computer readable medium for forming a design layout including phase-shifted features, the computer readable medium carrying instructions to cause one or more processors to perform the steps of:
receiving information from a fabrication layout design process about a particular phase-shift conflict in a first physical design layout,
wherein the phase-shift conflict could not be resolved in the fabrication layout design process that controls a location and a phase value of a shifter and does not control a location of a phase-shifted feature,
wherein the information indicates one or more features logically associated with the particular phase-shift conflict; and adjusting the first physical design layout based on the information to produce a second design layout.

19. A computer system for forming a design layout including phase-shifted features, the computer system comprising:
a memory medium; and
one or more processors configured for receiving information from a fabrication layout design process about a particular phase-shift conflict in a first physical design layout,
wherein the phase-shift conflict could not be resolved in the fabrication layout design process that controls a location and a phase value of a shifter and does not control a location of a phase-shifted feature,
wherein the information indicates one or more features logically associated with the particular phase-shift conflict; and
adjusting the first physical design layout based on the information to produce a second design layout.

20. A system for forming a design layout including phase-shifted features, the system comprising:
a fabrication layout design means for sending information about a phase-shift conflict in a first physical design layout, wherein the information indicates one or more features logically associated with the particular phase-shift conflict;
an adjusting means for adjusting the first physical design layout based on the information to-produce a second design layout; and
a phase-assignment graph means that logically associates the one or more features with the particular phase-shift conflict,
wherein a link on the phase assignment graph connects a node corresponding to a shifter to an adjacent node corresponding to an adjacent shifter when a phase value of the shifter constrains a phase value of the adjacent shifter, and
wherein each feature of the one or more features is associated with a shifter corresponding to a node connected through one or more links on the phase assignment graph to a particular node corresponding to a particular shifter involved in the particular phase-shift conflict.

21. The system of claim 20, further comprising:
a coloring means to provide relative phases for shifters employed in the second design layout; and
a phase-shift conflict checking means to determine whether there is a phase conflict based on the second design layout.

22. A method for fabricating a printed features layer including phase-shifted features, the method comprising:
running a physical design process to produce a first physical design layout using first design rules, the first physical design layout having phase-shifted features;
running a fabrication layout design process to produce a fabrication layout having shifters with phases for the phase-shifted features;
assigning relative phases to shifters positioned based on phase-shifted features in the first physical design layout;
determining whether there is a phase-shift conflict that can not be resolved in the fabrication layout design process; and
if there is a phase-shift conflict that can not be resolved in the fabrication layout design process, then sending information about the phase-shift conflict to the physical design process, wherein the information indicates one or more features logically associated with the particular phase-shift conflict,
adjusting the first physical design layout in the physical design process based on the information to produce a second design layout, and producing the printed features layer based on the adjusted design layer.

23. The method of claim 22 further comprising:
if there is not a phase-shift conflict that can not be resolved in the fabrication layout design process, then producing the printed features layer based on the first physical design layer.

24. A fabrication layout for a device having phase-shifted features, the fabrication layout comprising positions and phases for shifters determined by:
running a physical design process to produce an first physical design layout using first design rules, the first physical design layout having phase-shifted features;
running a fabrication layout design process to produce a fabrication layout having shifters with phases for the phase-shifted features;
assigning relative phases to shifters positioned based on phase-shifted features in the first physical design layout;
determining whether there is a phase-shift conflict that cannot be resolved in the fabrication layout design process; and
if there is a phase-shift conflict that cannot be resolved in the fabrication layout design process, then
sending information about the phase-shift conflict to the physical design process, wherein the information indicates one or more features logically associated with the particular phase-shift conflict;
adjusting the first physical design layout in the physical design process based on the information to produce a second design layout; and
running the fabrication layout design process to produce a fabrication layout having shifters and phases for the phase-shifted features of the second design layout.

25. A device having phase-shifted features, the device produced using a fabrication layout comprising positions and phases for shifters determined by:
running a physical design process to produce a first physical design layout using first design rules, the first physical design layout having phase-shifted features;
running a fabrication layout design process to produce a fabrication layout having shifters with phases for the phase-shifted features;
assigning relative phases to shifters positioned based on phase-shifted features in the first physical design layout;
determining whether there is a phase-shift conflict that can not be resolved in the fabrication layout design process; and
if there is a phase-shift conflict that can not be resolved in the fabrication layout design process, then
sending information about the phase-shift conflict to the physical design process, wherein the information indicates one or more features logically associated with the particular phase-shift conflict;
adjusting the first physical design layout in the physical design process based on the information to produce a second design layout; and
running the fabrication layout design process to produce a fabrication layout having shifters and phases for the phase-shifted features of the second design layout.

* * * * *